US009595573B2

(12) United States Patent
Adachi et al.

(10) Patent No.: US 9,595,573 B2
(45) Date of Patent: Mar. 14, 2017

(54) DISPLAY DEVICE HAVING LIGHT-EMITTING ELEMENTS INCLUDING METALS

(71) Applicants: Japan Display Inc., Tokyo (JP); Panasonic Liquid Crystal Display Co., Ltd., Himeji-shi, Hyogo (JP)

(72) Inventors: Masaya Adachi, Tokyo (JP); Kazutaka Tsuji, Tokyo (JP); Hajime Murakami, Tokyo (JP); Etsuko Nishimura, Chiba (JP)

(73) Assignees: Japan Display Inc., Tokyo (JP); Panasonic Liquid Crystal Display Co., Ltd., Himeji-shi (JP)

( * ) Notice: Subject to any disclaimer, the term of this patent is extended or adjusted under 35 U.S.C. 154(b) by 0 days.

(21) Appl. No.: 15/001,817

(22) Filed: Jan. 20, 2016

(65) Prior Publication Data
US 2016/0141345 A1 May 19, 2016

Related U.S. Application Data

(63) Continuation of application No. 14/833,951, filed on Aug. 24, 2015, now Pat. No. 9,276,052, which is a
(Continued)

(30) Foreign Application Priority Data

Dec. 12, 2002 (JP) .................. 2002-360283

(51) Int. Cl.
*H01L 27/32* (2006.01)
*H01L 51/52* (2006.01)
(Continued)

(52) U.S. Cl.
CPC ...... *H01L 27/3258* (2013.01); *H01L 27/3246* (2013.01); *H01L 27/3248* (2013.01);
(Continued)

(58) Field of Classification Search
CPC ............ H01L 27/3258; H01L 27/3248; H01L 27/3246; H01L 51/5246; H01L 27/3265; H01L 27/3262; H01L 51/5262
See application file for complete search history.

(56) References Cited

U.S. PATENT DOCUMENTS

| 5,834,893 A | 11/1998 | Bulovic et al. |
| 5,910,706 A | 6/1999 | Stevens et al. |

(Continued)

FOREIGN PATENT DOCUMENTS

| JP | 2001-507503 A | 6/2001 |
| JP | 2001-332388 A | 11/2001 |

(Continued)

OTHER PUBLICATIONS

Miyaguchi, et al. "Organic LED Full-Color Passive-Matrix Display", Journal of the SID 713, 1999, pp. 221-226.
(Continued)

*Primary Examiner* — Joseph L Williams
(74) *Attorney, Agent, or Firm* — Typha IP LLC

(57) ABSTRACT

A display device includes a plurality of light-emitting elements aligned on a TFT substrate in a formation of a matrix. The plurality of light-emitting elements each have a flat surface portion and including a light-emitting layer, an anode, and a cathode, an insulating layer formed on the TFT substrate and under the light emitting element, and a tilted metal surface provided on a peripheral area surrounding the flat surface portion of the light-emitting element and having a tilt angle with respect to the flat surface portion of the light-emitting element. The tilted metal surface is provided on a surface of a slope of a bank that is provided on the insulation layer, and a width of a cross-section of the bank
(Continued)

becomes smaller as the cross section comes farther away from a surface of the TFT substrate. A counter substrate is placed on the TFT substrate.

20 Claims, 32 Drawing Sheets

Related U.S. Application Data continuation of application No. 14/589,237, filed on Jan. 5, 2015, now Pat. No. 9,153,634, which is a continuation of application No. 14/327,098, filed on Jul. 9, 2014, now Pat. No. 8,928,221, which is a continuation of application No. 14/045,162, filed on Oct. 3, 2013, now Pat. No. 8,791,632, which is a continuation of application No. 13/477,590, filed on May 22, 2012, now Pat. No. 8,558,449, which is a continuation of application No. 13/206,915, filed on Aug. 10, 2011, now Pat. No. 8,193,697, which is a continuation of application No. 12/631,326, filed on Dec. 4, 2009, now Pat. No. 8,049,405, which is a continuation of application No. 11/852,153, filed on Sep. 7, 2007, now Pat. No. 7,812,515, which is a continuation of application No. 11/361,298, filed on Feb. 23, 2006, now Pat. No. 7,279,833, which is a continuation of application No. 10/653,623, filed on Sep. 2, 2003, now Pat. No. 7,030,556.

(51) Int. Cl.
*H05B 33/04* (2006.01)
*H05B 33/14* (2006.01)
*H05B 33/22* (2006.01)
*H05B 33/02* (2006.01)

(52) U.S. Cl.
CPC ...... *H01L 27/3262* (2013.01); *H01L 27/3265* (2013.01); *H01L 51/5203* (2013.01); *H01L 51/524* (2013.01); *H01L 51/525* (2013.01); *H01L 51/5237* (2013.01); *H01L 51/5246* (2013.01); *H01L 51/5262* (2013.01); *H01L 51/5271* (2013.01); *H01L 51/5275* (2013.01); *H05B 33/02* (2013.01); *H05B 33/04* (2013.01); *H05B 33/14* (2013.01); *H05B 33/22* (2013.01); *H01L 27/322* (2013.01); *H01L 27/3211* (2013.01); *H01L 27/3295* (2013.01); *H01L 51/5206* (2013.01); *H01L 51/5221* (2013.01); *H01L 51/5234* (2013.01); *H01L 51/5281* (2013.01); *H01L 2251/5315* (2013.01); *H01L 2251/5353* (2013.01)

(56) References Cited

U.S. PATENT DOCUMENTS

| | | | |
|---|---|---|---|
| 6,320,633 | B1 | 11/2001 | Broer et al. |
| 6,828,725 | B2 | 12/2004 | Kimura et al. |
| 6,831,407 | B2 | 12/2004 | Cok et al. |
| 6,833,667 | B2 | 12/2004 | Hamano et al. |
| 6,872,973 | B1 | 3/2005 | Koyama et al. |
| 6,894,432 | B2 | 5/2005 | Fujieda et al. |
| 6,906,452 | B2 | 6/2005 | Ichikawa |
| 7,019,454 | B2 | 3/2006 | Suzuki et al. |
| 7,030,556 | B2 | 4/2006 | Adachi et al. |
| 2001/0020922 | A1 | 9/2001 | Yamazaki et al. |
| 2002/0024096 | A1 | 2/2002 | Yamazaki et al. |
| 2002/0070663 | A1 | 6/2002 | Ogura et al. |
| 2002/0084747 | A1 | 7/2002 | Fujieda et al. |
| 2002/0101152 | A1 | 8/2002 | Kimura |
| 2002/0113546 | A1 | 8/2002 | Seo et al. |
| 2003/0164679 | A1 | 9/2003 | Hamano et al. |
| 2004/0050232 | A1 | 3/2004 | Lee |
| 2004/0056585 | A1 | 3/2004 | Suzuki et al. |
| 2004/0160165 | A1 | 8/2004 | Yamauchi et al. |
| 2004/0211307 | A1 | 10/2004 | Lee |
| 2005/0116620 | A1 | 6/2005 | Kobayashi |
| 2005/0162356 | A1 | 7/2005 | Koyama et al. |
| 2005/0257657 | A1 | 11/2005 | Lee |
| 2005/0260337 | A1 | 11/2005 | Ogura et al. |
| 2009/0015524 | A1 | 1/2009 | Koyama et al. |
| 2010/0060620 | A1 | 3/2010 | Yamazaki et al. |
| 2012/0306832 | A1 | 12/2012 | Yamazaki et al. |
| 2014/0247256 | A1 | 9/2014 | Yamazaki et al. |
| 2014/0253811 | A1 | 9/2014 | Koyama et al. |

FOREIGN PATENT DOCUMENTS

| | | |
|---|---|---|
| JP | 2002-151253 A | 5/2002 |
| JP | 2002-202737 A | 7/2002 |
| JP | 2002-229482 A | 8/2002 |
| JP | 2002-260844 A | 9/2002 |
| JP | 2002-324673 A | 11/2002 |
| JP | 2002-540458 A | 11/2002 |
| JP | 2003-115392 A | 4/2003 |
| JP | 2003-257659 A | 9/2003 |
| JP | 2003-272873 A | 9/2003 |
| JP | 2004-063404 A | 2/2004 |
| JP | 2004-165017 A | 6/2004 |
| JP | 2014-197204 A | 10/2014 |
| JP | 2015-065185 A | 4/2015 |
| JP | 2015-111276 A | 6/2015 |
| JP | 2015-129945 A | 7/2015 |
| WO | 98/28747 A1 | 7/1998 |

OTHER PUBLICATIONS

Shimoda et al. "26.3: Multicolor Pixel Patterning of Light-Emitting Polymers by ink-Jet Printing" ISSN0099-0966X/99/3001, 1999 SID.

Tanaka, "Trend and Aspect of Organic EL Displays", The Journal of the Institute of Image Information and Television Engineers, (2000), vol. 54, No. 8, pp. 1115-1120.

EXPOSURE

DISPLAY DEVICE HAVING LIGHT-EMITTING ELEMENTS INCLUDING METALS

CROSS-REFERENCE TO RELATED APPLICATIONS

This application is a continuation of U.S. patent application Ser. No. 14/833,951, filed on Aug. 24, 2015, now U.S. Pat. No. 9,276,052, which is a continuation of U.S. application Ser. No. 14/589,237, filed on Jan. 5, 2015, now U.S. Pat. No. 9,153,634, which is a continuation of application Ser. No. 14/327,098, filed Jul. 9, 2014, which is a continuation of U.S. application Ser. No. 14/327,098, filed on Jul. 9, 2014, now U.S. Pat. No. 8,928,221, which is a continuation of U.S. application Ser. No. 14/045,162, filed on Oct. 3, 2013, now U.S. Pat. No. 8,791,632, which is a continuation of U.S. application Ser. No. 13/477,590, filed on May 22, 2012, now U.S. Pat. No. 8,558,449, which is a continuation of U.S. application Ser. No. 13/206,915, filed on Aug. 10, 2011, now U.S. Pat. No. 8,193,697, which is a continuation of U.S. application Ser. No. 12/631,326, filed on Dec. 4, 2009, now U.S. Pat. No. 8,049,405, which is a continuation of U.S. application Ser. No. 11/852,153, filed on Sep. 7, 2007, now U.S. Pat. No. 7,812,515, which is a continuation of U.S. application Ser. No. 11/361,298, filed on Feb. 23, 2006, now U.S. Pat. No. 7,279,833, which is a continuation of U.S. application Ser. No. 10/653,623, filed on Sep. 2, 2003, now U.S. Pat. No. 7,030,556, and claims the benefit of priority under 37 CFR 119 of Japanese application no. 2002-360283, filed on Dec. 12, 2002, all of which are incorporated herein by reference.

FIELD OF THE INVENTION

The present invention relates to a light-emitting element and a display device that presents picture images by controlling the light-emission operation of the light-emitting element, especially, to a technology that can be effective to such a light-emitting element as an organic light-emitting diode and to a display device equipped with the organic light-emitting diode.

BACKGROUND OF THE INVENTION

An organic light-emitting diode (abbreviated as OLED hereinafter) is a device that converts electric energy to light energy by injecting hole and electron to a light-emitting layer constructed with an organic thin layer. A display device constructed with OLED (abbreviated as OLED display, hereinafter) features the thinness and lightness because no additional light as backlight is required due to the self light-emitting capability. Furthermore, OLED display has other features as wide viewing angle and quick time-response in display characteristics.

FIG. 33 shows an example of a conventional OLED construction and a substantial sectional view of the drawing that explains the display operation. This OLED is constructed with transparent electrode 200 functioning as an anode, hole transporting layer 103, light-emitting layer 102, an electron transporting layer 101, a reflective electrode 300 made of light-reflective metal that functions as a cathode on a transparent substrate 400, layered in this order. Once a DC voltage is applied between the transparent electrode 200 and the reflective electrode 300, the holes injected through the transparent electrode 200 travels in the hole transporting layer 103, the electrons injected through the reflective electrode 300 travels in the electron transporting layer 101. Both holes and electrons reach the light-emitting layer 102 where electron-hole recombination occurs and a light with certain wave length is emitted. A part of the emitted light from the light-emitting layer 102 is observed through the transparent substrate 400 by a viewer 1000. The light that emits in roughly parallel to the boundary surface of the layers or the light that has larger incident angle against the boundary surface than the critical angle between the two layers thereof is propagated in parallel to the boundary surfaces and does not travel to the viewer and therefore they are not effectively used for display lights. The external coupling efficiency (the ratio of amount of the light extracted to the viewer 1000 to the emitted light from the light-emitting layer 102, that, is to say, the ratio of external quantum efficiency to internal quantum efficiency) is generally estimated to be about 20% on the basis of classical ray optics. The large amount of the light generated at the light-emitting layers travels in parallel to the boundary surface of the layers and become a loss in the display system. Therefore, in order to realize low consumption power and bright OLED, it is quite important to reduce the light guiding loss and raise the external coupling efficiency.

The references as Patent 1 and Patent 2 shown below describe OLEDs that have reflection surfaces with the tilted surfaces in order to reduce the guiding loss. For these cases, the description says the light emitted from the light-emitting layers travels in parallel or substantially parallel to the substrate or the layered film, is reflected at the tilted reflective surface and changes the traveling direction, which results into the reduction of light guiding loss and the improvement of the external coupling efficiency.

REFERENCES

Patent 1: JP laid-open publication 2001-332388
Patent 2: JP domestic publication 2001-507503

FIG. 34 shows a cross sectional view of an example of conventional OLEDs. As shown in FIG. 34, a portion of the light which is emitted from the organic layer 100 including the light-emitting layer travels in parallel or substantially parallel to the substrate is reflected at the tilted reflective surface (shown as the tilted surface of the electrode 300) and then change the propagation direction to the viewer 1000. However the light that is emitted from the light-emitting layer and incidents to the tilted reflective surface is a part of the light emitted from the light-emitting layer, therefore large part of the light still is lost in the traveling and not effectively used. Furthermore, a portion of the light emitted from a pixel of the light-emitting layer does not incident to the tilted reflective surface and travels into a different pixel, then incident to the tilted reflective surface formed in such a different pixel and change the direction to the viewer. This may cause an optical cross-talk and a blur of display. Furthermore, as shown in FIG. 34, when the tilted reflective surface is used as an electrode for an element of OLED, disconnection failure easily happens at the different step level at the location where the electrode steps ride over the tilted reflective surface.

The objective of this invention is to solve various problems as described above and the light emitted from the light-emitting layer contributes much to the display light and realizes a bright display and then high quality picture is provided as no blur is generated. Furthermore, other objectives of this invention are to provide fault free OLED that has no disconnection failure. The other purposes of this invention will be clarified in the following descriptions.

SUMMARY OF THE INVENTION

In order to achieve the above purposes, the display device according to the present invention is a display device having plurality of light-emitting elements that construct picture elements aligned on a substrate in a formation of a matrix, wherein the light-emitting element comprising a flat surface of a light-emitting layer made at least in a portion therein and a tilted reflective surface at least in a portion therein, of which the tilted reflective surface is made in the peripheral areas surrounding said surface of a light-emitting layer and has a tilt angle against the flat surface, wherein an optical waveguide layer is filled in an area surrounded by said tilted reflective surface on said light-emitting layer by which light generated at said light emitting layer is guided to the peripheral areas and wherein the optical waveguide layer is optically isolated from each picture element by the tilted reflective surface. Furthermore, the tilted reflective surface is made on the surface of a slope formed by a bank that is made on said substrate wherein cross sectional width of said bank is narrower against distance farther from surface of said substrate, therefore the said optical waveguide layer has a cross sectional formation as a cross sectional width of said optical waveguide layer is wider against distance farther from surface of the substrate.

In order to realize an optical waveguide layer that is optically isolated from the other picture elements, the height of the tilted reflective surface from the flat surface of the light-emitting layer is larger than the maximum height of the optical waveguide layer or the optical waveguide layer is formed in a construction as the optical waveguide layer is isolated from the other optical waveguide layers for each picture element.

For this light-emitting element, we can use an organic light-emitting diode constructed with a reflective electrode that functions as an optical reflector, a light-emitting layer consisting of an organic layer and a transparent electrode stacked in order from said substrate. In this case, it is desirable that the refractive index of the optical waveguide layer is larger than that of the air and lower than that of the transparent electrode. Furthermore, a sealing material that is transparent against visible light and has gas barrier characteristics is set on a side of the light-emitting layer made on the substrate wherein the substrate and the sealing material are adhesively bound with a gap that has substantially same refractive index as the air.

In the display device constructing as described above, the light emitted from the light-emitting layer goes into the optical waveguide layer as emitted or passing through the transparent electrode after reflecting on the reflective electrode. A part of light, among the light incident to the boundary between the optical waveguide layer and the air gap (we call the surface of the optical waveguide layer, hereinafter), is reflected with the smaller incident angle than the critical angle however the most of the light travels to the viewer with passing through the air gap and the sealing material. On the other hand, the part of the light, among the light incident to the optical waveguide layer, which has a larger incident angle to the surface of the optical waveguide layer is totally reflected at the surface of the optical waveguide layer and travels within the optical waveguide layer in parallel to the substrate. The light traveling in the optical waveguide layer comes up to the tilted reflective surface in course of time, the propagation direction is changed by the reflection thereon and the light that is incident to the surface of the optical waveguide layer with a smaller incident angle than the critical angle partly propagates towards the viewer therefore is effectively used as the display image light.

In short, the light guided in parallel to the substrate therefore regarded as light loss in the conventional technologies is guided to the tilted reflective surface in a good efficiency and the light extracting ratio is improved. In this case, since the optical waveguide layer is completely isolated from each other by each picture element, the light emitted from the light-emitting layer is not guided to the different picture elements therefore a display with high picture-quality is realized without degrading picture-quality seen in optical cross-talk or blur.

PREFERRED EMBODIMENT OF THE INVENTION

Hereinafter, exemplary embodiments of this invention will be discussed in conjunction with the drawings as needed.

The First Embodiment

Figure 1:
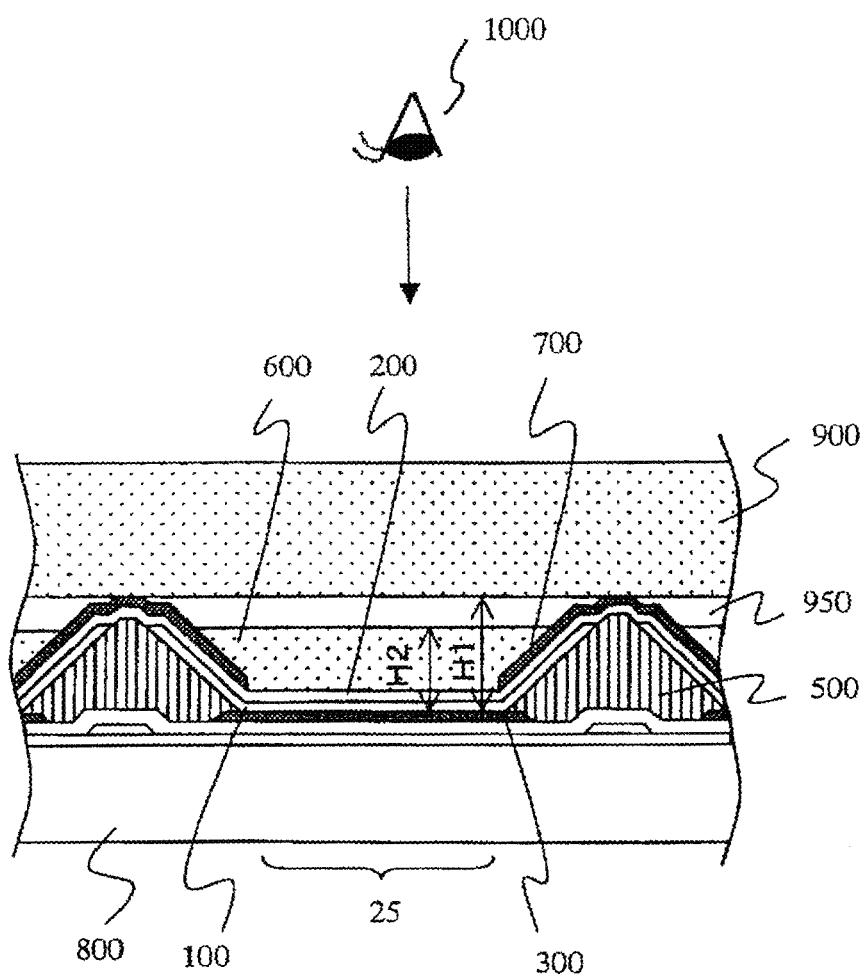
FIG. 1 is a cross sectional view of a picture element explaining the first embodiment of the display device according to the present invention.
Figure 2:
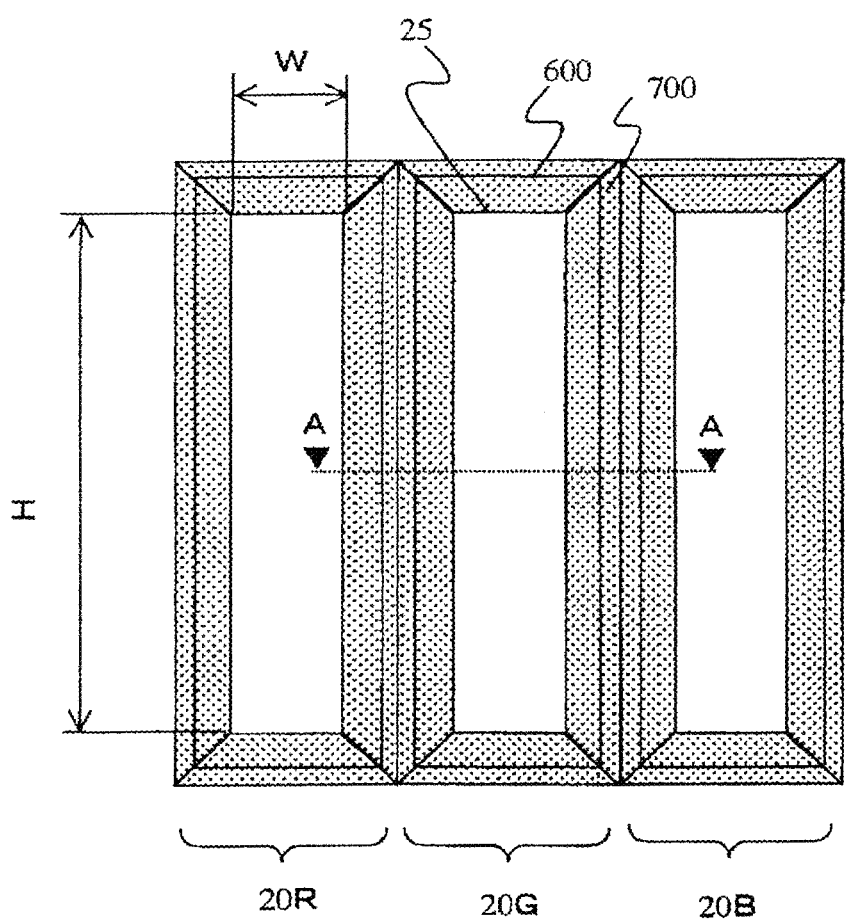
FIG. 2 is a plan view explaining the first embodiment of the display device according to the present invention.

FIG. 1 shows the cross sectional view of one picture element explaining the first embodiment of this invention. FIG. 2 shows another drawing explaining the first embodiment. FIG. 1 corresponds to the cutaway view along the line of A-A in FIG. 2. One color picture element consists of three picture elements of red-light-emitting picture element 20R, green-light-emitting picture element 20G and blue-light-emitting picture element 20B which are arranged in side-by-side as shown in FIG. 2 and the predetermined color is presented by additive color mixing of the lights emitted from these three picture elements. In addition, these picture elements 20R, 20G and 20B are called as unit picture elements or sub-pixels and a unit picture element corresponds to a mono-chromatic picture element for the case of mono-chromatic display device.

For the display device according to the present invention, wires, switching elements, storage capacitors and insulating layers formed on the substrate as appropriate, however they are not shown in the drawings. Reflective electrodes 300 consisting of conduction material with optical reflecting characteristics that are formed on the substrate in a form of an island as corresponding to the picture element and banks 500 made of insulator material are formed as covering edges of reflective electrodes 300 at the peripheral areas thereof. The bank 500 has a cross sectional formation in a shape as the width is getting narrow as getting farther from the substrate 800 and has tilted surfaces at its side areas. On the part of the tilted surface and the reflective electrode, an organic layer 100 that includes the light-emitting layer formed in each picture element in a form of an island and furthermore a transparent electrode 200 is formed thereon.

The transparent electrode 200 and the reflective electrode 300 function as an anode (or cathode) and a cathode (or anode), respectively and composes an organic light emitting diode with an organic layer 100 formed on these electrodes. The organic layer 100 is constructed in three layered forms as an electron transporting layer, a light-emitting layer and a hole transporting layer in order from the cathode side or in two layered form as a single layer functioning as light-emitting and electron transporting by using a material of dual use. Furthermore, the construction of the organic light emitting diode, that has an additional anodic buffer layer between the anode and the hole transporting layer, can be used.

A tilted reflective surface 700 consisting of optical reflective metal is formed on the transparent electrode 200 and on the location corresponding to the surface of a slope formed by a bank 500. Furthermore, an optical waveguide layer 600 that is transparent to the visible lights and that is composed by a material that has a larger refractive index than that of the air is filled in the basin-like area surrounded by the tilted reflective surface 700. Moreover, since the organic layer 100 is usually degraded by the moisture included in the air, it is desirable that it should be sealed by a seal-off means from the open air so that it is not exposed to the open air. In this case, a construction such that the bank 500 works as spacer and a seal-off material 900 and the substrate 800 are fixed by an adhesive seal material cemented in a frame-like form around the display portion of the display device is shown.

A glass plate, a plastic film post-processed for gas barrier or a layered plate with thin glass and plastic film can be used for the seal-off material 900. For this construction, it is important to set a gap 950 which has the similar refractive index to the air between the seal-off material 900 and the optical waveguide layer 600. Because if the seal-off material 900 and the optical waveguide layer 600 contact each other then the light emitted from the organic layer 100 and propagating in the optical waveguide layer 600 comes into the seal-off is material 900 and does not come up to the viewer 1000 as resulting in a loss or travels into other picture element and comes up to the viewer 1000 thereafter as resulting in problems of cross-talk and blur.

Inert gas as nitrogen gas may be enclosed in the gap 950, and the assembly is done as nitrogen gas is enclosed and the seal-off material and the substrate 800 are bound in air-tight. Furthermore, setting gap 950 implies that the optical waveguide layer 600 does not contact to the seal-off material 900 and preferably the gap 950 should be set larger than the distance over which the light cannot travels from the optical waveguide layer 600 to the seal-off material 900 due to the tunneling phenomenon of photons. Since the tunneling phenomenon occurs for a gap shorter than the wavelength of visible light and the gap 950 more than 1 μm is sufficient.

Moreover, it is important to keep the height H2 from a flat surface 25 of the organic light emitting diode which is from the reflective electrode 300 to the optical waveguide layer 600 smaller than the height H1 at the upper end of the tilted reflective surface 700. The reason is from the optical cross-talk and blur that are caused by the phenomena that the light emitted from the organic layer 100 traveling in the optical waveguide layer 600 may propagate over the tilted reflective surface 700 for the case when the height H2 of the optical waveguide layer 600 is larger than the height H1 of the tilted reflective surface 700, invade into different picture elements and then externally travel therefrom. Furthermore, for the case when the flat seal-off material 900 is set as the bank 500 used as a spacer, the optical waveguide layer 600 contacts the seal-off material 900 unless H1>H2 is kept then the light invading from the optical waveguide layer 600 to the seal-off material 900 causes problems as reduction of the external coupling efficiency, optical cross-talk and blur.

Figure 3:
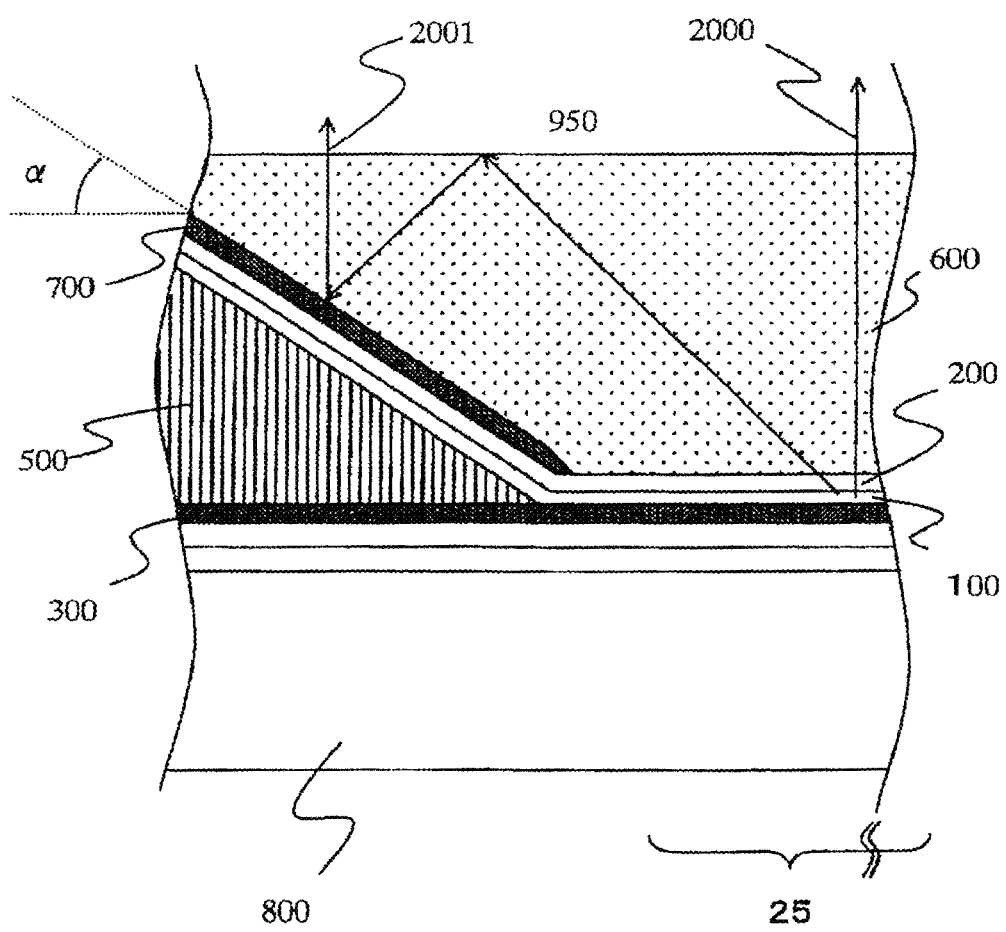
FIG. 3 is a cross sectional view explaining an example of operation of the first embodiment of the display device according to the present invention.

FIG. 3 is a cross sectional drawing to explain an example of operation for the first embodiment of the display device according to the present invention. Once DC voltage is applied to the transparent electrode 200 and the reflective electrode 300 in response to the picture signal, the holes injected through the anode travel in the hole transporting layer and electrons injected trough the cathode travel in the electron transporting layer, respectively, and both holes and electrons reach to the emitting layer. The recombination of an electron and a hole occurs in the emitting layer and light emission is taken place. The light emitted from the light emitting layer that constructs the organic layer 100 comes into the optical waveguide layer 600 through the transparent electrode 200 as is emitted or after reflected at the reflective electrode 300. The lights, among the lights coming into the optical waveguide layer 600, that come to the boundary between the optical waveguide layer 600 and the gap 950 with a smaller incident angle than the critical angle partly reflects but mostly come up to the viewer after passing through the gap 950 and the seal-off material 900 which is not shown, and are used as display image lights 2000.

On the other hand, the lights coming onto the surface of the optical waveguide layer 600 with a larger angle than the critical angle is totally reflected at the surface of the optical waveguide layer 600 and propagates in the optical waveguide layer 600 in parallel to the surface of the substrate 800. The light traveling in the optical waveguide layer 600 finally comes to the tilted reflective surface 700, the direction of the propagation changes by the reflection, a part of lights that come into the surface of the optical waveguide layer 600 with smaller incident angle than the critical angle comes to the viewer and are effectively used as display image light 2001. In other wards, the light traveling in parallel to the substrate 800 resulting in a loss in the conventional technology is led to the tilted reflective surface 700 by the optical waveguide layer 600 and changes the propagation direction by the reflection at the tilted reflective surface 700. Then, since the light is effectively used as the display image light, the external coupling efficiency has been improved. For this case, since the optical waveguide layer 600 is completely isolated, the light emitted from an organic layer of a certain picture element does not propagate in other different picture elements and no problem as optical cross-talk or blur of presentation occurs.

The improvement of the external coupling efficiency by suppression of light loss due to above propagation becomes more as the ticker optical waveguide layer in comparison to the area of the light-emitting portion is made. In other words, though the portion of the flat surface 25 is the light-emitting area, the thicker the optical waveguide layer 600 is, the higher the external coupling efficiency can be. The reason is as follows.

The light guided in the optical waveguide layer 600 mainly travels to the tilted reflective surface 700 with repeating the reflection at the surface of the optical waveguide layer 600 and that at the reflective electrode 300. For this case, since the reflectance of the reflective electrode 300 is not 100%, usually, the light is partly absorbed and lost by reflective electrode. Therefore, if the number of times for the reflection at the reflective electrode 300 until the light guided in the optical waveguide layer 600 comes to the tilted reflective surface 700 can be reduced, the optical loss by the reflective electrode 300 becomes less and high efficiency of the light extraction from the display can be obtained. Moreover, since no guiding of the light in the optical waveguide layer can provide no improvement of external coupling efficiency, the thickness of the optical waveguide layer should be larger than the wavelength of the light so that the good propagation of the light is obtained. For this purpose, the thickness of the optical waveguide layer should be larger than 1 μm.

As shown in FIG. 2, if the length H in the up-down orientation is longer than the length W in the left-right orientation in the plane of the emitting area, then the relation as (H2/W)>(H2/H) is obtained. In this case the external coupling efficiency for the left-right orientation is higher than that for the up-down orientation and the viewing angle is wider in right-left orientation than in up-down orientation. This fact is useful because the wider viewing angle in the right-left orientation is preferred than that of the up-down orientation and the limited light has to be served to the viewers. In other words, the conventional OLED display has an isotropic viewing angle for the light intensity which is uniform for every direction, however this invention can control the viewing angle characteristics of the light intensity by controlling the ratio of the thickness of the optical waveguide layer to the length of the light emitting area for the specific orientation. Therefore we can realize the optimum light intensity characteristic for each particular application of the display devices.

Figure 4:
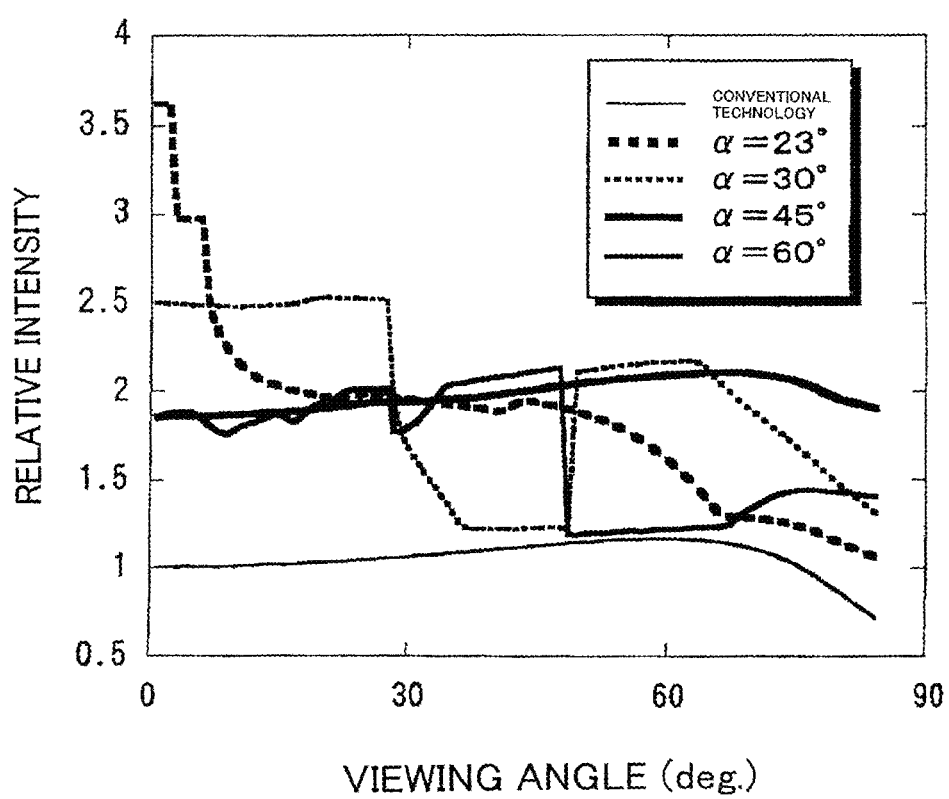
FIG. 4 is an explanatory schematic that shows the estimation of the viewing angle characteristics of the light intensity against the slope angle $\alpha$.

Instead of this case, the viewing angle characteristics against the light intensity can be controlled by the tilt angle α of the tilted reflective surface 700 against the surface (substrate surface) that is a flat surface 25 in this invention. FIG. 4 shows the schematics diagram of the viewing angle characteristics against the light intensity as a function of the tilt angle α of the tilted reflective surface 700. FIG. 4 is provided for the case of the ratio H2/W=0.1 for the length W (see FIG. 2) of the light emitting area and the thickness H2 of the optical waveguide layer 600 (see FIG. 1) and the refractive index 1.5 for the optical waveguide layer and shows the estimation results for two-dimensional model. The horizontal axis shows the viewing angle and the vertical axis shows the relative light intensity normalized to the light intensity obtained at the front position (intensity at 0° viewing angle) by the conventional OLED that has flat and plane layered construction. As shown in this diagram, the viewing angle characteristics of the light intensity can be changed by changing the tilt angle α. For example, we can see the high light intensity at the front direction and the adjacent direction is obtained for α=23°~30°, almost constant light intensity characteristics for wide range of viewing angle for α=45° and the viewing angle characteristics as remarkably decreasing over 50° viewing angle for α=60°.

The tilted reflective surface is not the slope surface constructed in a complete flat surface for actual cases, the tilt angle α tends not to be constant over the tilted reflective surface and to constantly vary in accordance with the location of the tilted reflective surface. Therefore, for the application as the display device for portable phones which a single person mostly uses at a time, wide viewing angle is not requested but high intensity at the front direction is preferred. Therefore the average angle values for the tilt angle α should beset as 20°~30° and the higher intensity at the front orientation in comparison to the inclined orientation against the front orientation is preferred, reversely, the wider viewing angle and the brighter picture image are preferred with the average value of a to approximately be 45° for the TV set applications wherein the display watched by many people. In addition, since the present estimation is the calculated result provided in a limited condition under a simple two-dimensional model, the result cannot be used for the exact quantitative evaluation but be effective for the relative evaluation in a qualitative study.

Figure 5:
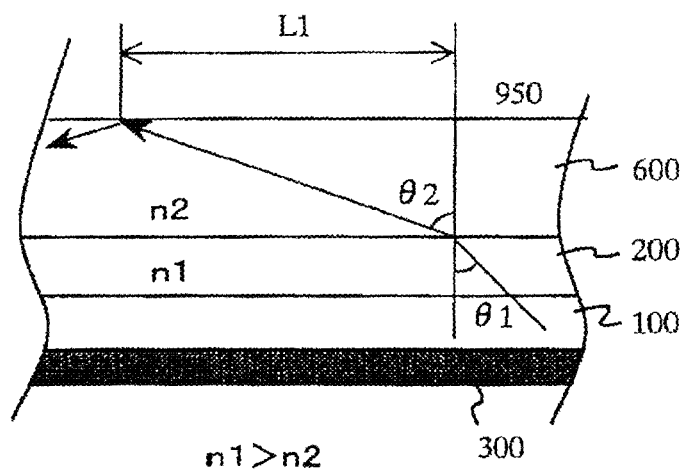
FIG. 5 is an explanatory schematic of the light traveling in the optical waveguide layer in the case that the refractive index of the optical waveguide layer is smaller than that of the transparent electrode.
Figure 6:
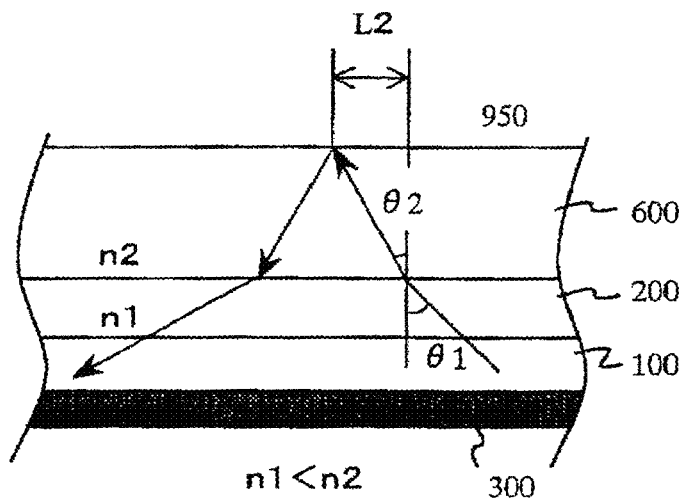
FIG. 6 is an explanatory schematic of the light traveling in the optical waveguide layer in the case that the refractive index of the optical waveguide layer is larger than that of the transparent electrode.

Next, we explain the relation between the refractive indices of optical waveguide layer 600 and transparent electrode 200. FIG. 5 and FIG. 6 are the schematics to explain the effect against the external coupling efficiency. FIG. 5 is for the case that the refractive index of the optical waveguide layer is smaller than that of the transparent electrode and FIG. 6 is for the case that the refractive index of the optical waveguide layer is larger than that of the transparent electrode. Once we define the refractive index of the transparent electrode n1, that of the optical waveguide layer n2, incidental angle θ1 of the light from the transparent electrode to the optical waveguide layer and refraction angle θ2, we obtain sin θ1/sin θ2=n2/n1 from Snell's law. Therefore, for the case when the refractive index n1 of the optical waveguide layer 600 is smaller than the refractive index n2 of the transparent electrode, the refraction angle θ2 is larger than the incident angle θ1.

On the other hand, when the refractive index n1 of the optical waveguide layer 600 is larger than the refractive index n2 of the transparent electrode, the refraction angle θ2 is smaller than the incident angle θ1. Therefore, if we define the propagation distance without reflection in the optical waveguide layer 600 as L1 for the case of n1>n2 and L2 for n1<n2, L1 is larger than L2. The fact that the propagation length without reflection of the light traveling in the optical waveguide layer 600 is long implies that the times of reflection at the reflective electrode 300 until the light traveling up to the tilted reflective surface 700, therefore it means the light loss by the absorption by the reflective electrode becomes less. For this reason, it is desirable to keep the refractive index of the optical waveguide layer less than that of the transparent electrode for the purpose of improving the external coupling efficiency. It should be noted that a critical angle exists between the transparent electrode 200 and the optical waveguide layer 600 and the light with larger incident angle from the transparent electrode to the optical waveguide layer is totally reflected and cannot be led to the optical waveguide layer 600.

Reversely, the critical angle does not exist for the case of n1<n2, therefore the incident angle which even becomes to be the critical angle for the case of n1>n2, the light can be led from the transparent electrode to the optical waveguide layer. However, since such a light is totally reflected at the surface of the optical waveguide layer 600 and returns back to the reflective electrode 300, the light is repeatedly reflected by the surface of the optical waveguide layer 600 and the reflective electrode 300 and is lost by the decay. To prevent this phenomenon, it is necessary to increase the thickness of the optical waveguide layer by which the times of reflection of the light at the reflective surface 300 can be reduced until the light reaches to the tilted reflective surface 700 while traveling in the optical waveguide layer. However, in general, the refractive index of the transparent electrode 200 is rather high as 1.8 to 2.2 and it takes long time to form a transparent material (titanium oxide, for instance) that has larger refractive index than this in a thickness of an order of micron meters without damage onto the organic layer therefore such formation is not industrially desirable. Therefore, it is desirable that the refractive index of the optical waveguide layer should be larger than that of the air and less than that of the transparent electrode and the optical waveguide layer be made of a transparent plastic material that is relatively formed in ease. For this purpose, it is practical and realistic to select the refractive index of the optical waveguide layer be 1.3 to 1.7.

Figure 7:
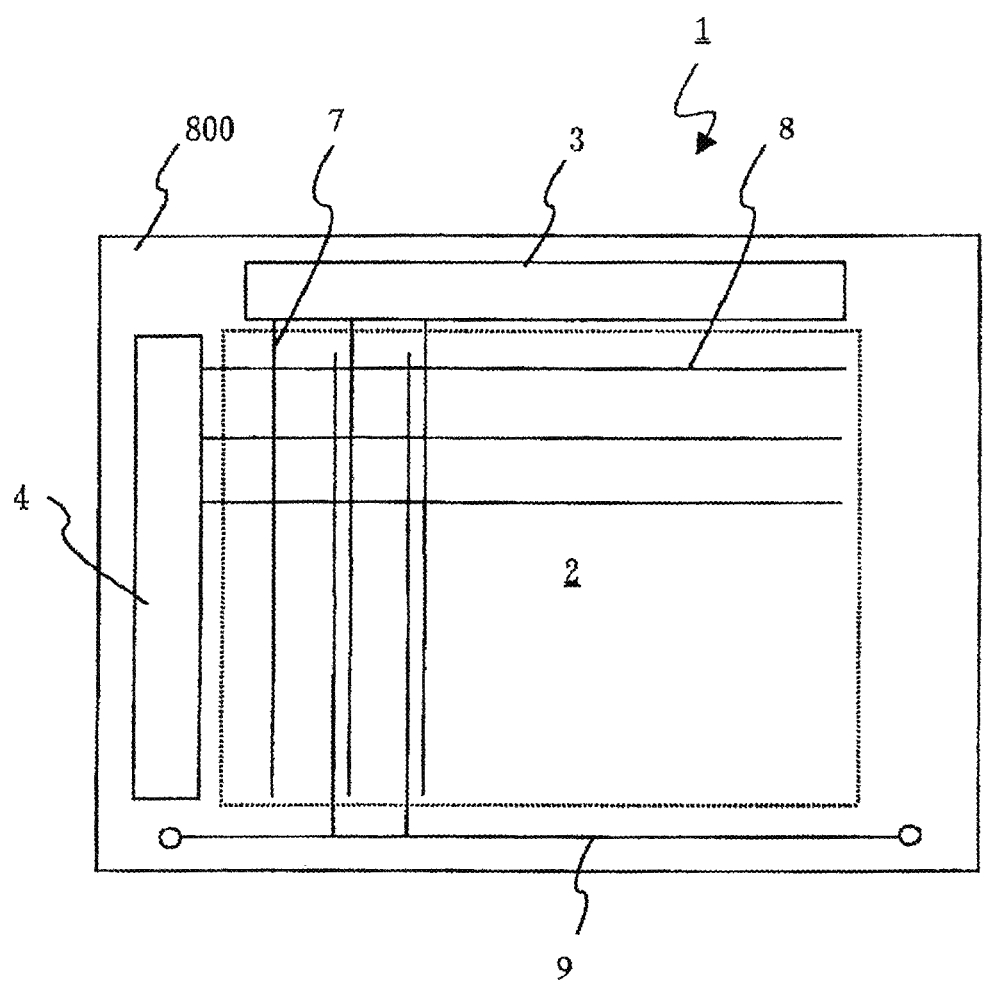
FIG. 7 is a block diagram showing the whole layout of the embodiment of the display device according to the present invention.
Figure 8:
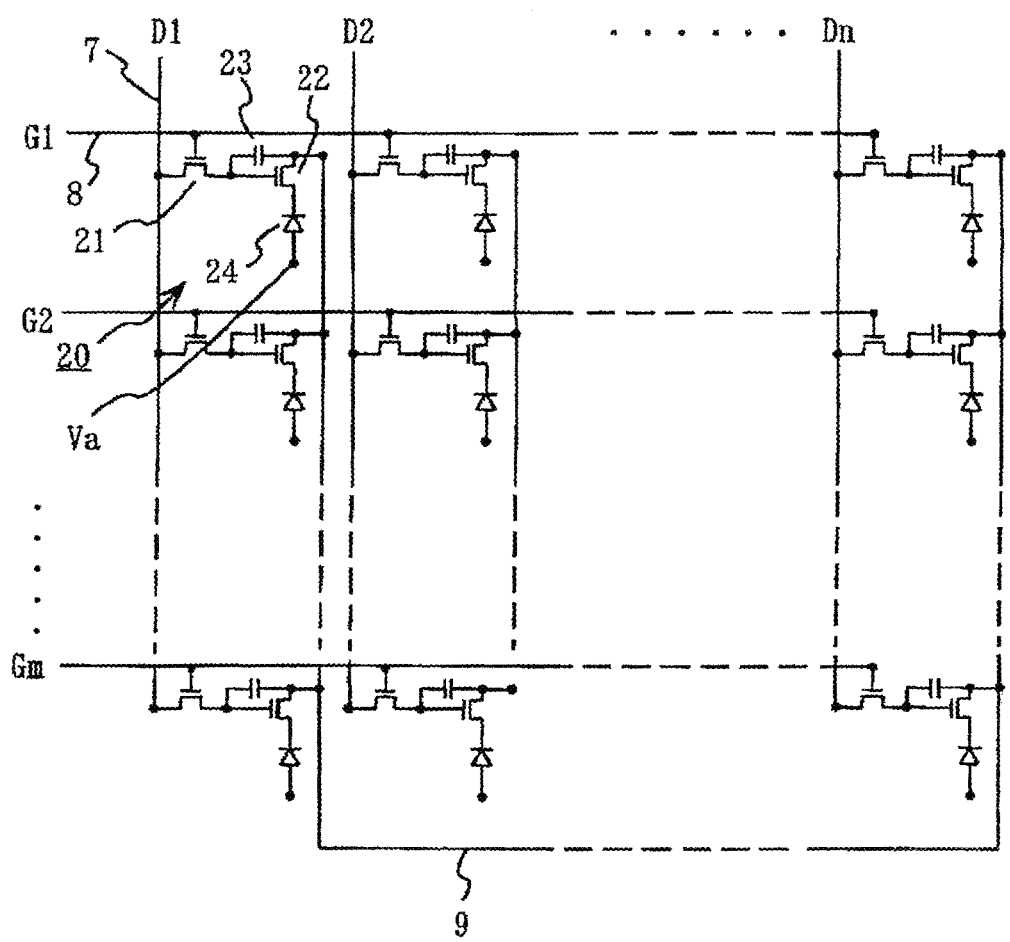
FIG. 8 is an equivalent circuit diagram of the active matrix that composes the display device shown in FIG. 7.

Next, we explain an embodiment of the display device with reference to the schematics. FIG. 7 shows a schematic of the whole layout of the embodiment. FIG. 8 is an equivalent circuit of the active matrix constructed on the display portion 2. As shown in FIG. 7, the display device 1 has a display portion 2 at the substantially center of the substrate 800. In this display portion 2, a data driver circuit to output the picture signals to a plurality of data lines 7 is constructed in the upper part of the display portion and a scan driver circuit to output the scan signals to a plurality of gate lines 8. The driver circuits 3 and 4 comprise shift register circuits, level shifter circuits and analogue circuits which are composed of P channel and N channel TFTs (Thin Film Transistors) in a complementary configuration. The line 9 is a common voltage line.

In this display device 1, being same as active matrix liquid crystal display devices, a plurality of gate lines and that of data lines are set in crossing over in the direction of the expansion and the picture element 20 is set at each cross point of gate lines G1, G2, . . . , Gm and data lines D1, D2, . . . , Dn. Each picture element is composed of a light-emitting element 24 consisting of an OLED, storage capacitor 23, a switching transistor 21 of an N channel TFT of which gate electrode is connected to the gate line, either a source or a drain electrode to the data line and the other to the storage capacitor 23 and a driver transistor 22 of an N channel TFT of which the gate electrode is connected to the storage capacitor 23, the source electrode is connected to the common voltage line 9 extending in the same direction as the data lines and the drain electrode is connected to the cathode of an OLED that composes the light-emitting element 24. Moreover, the anode of an OLED that constructs a light-emitting element 24 is connected to a current supply line commonly used for all picture elements and kept in the same voltage Va. The light-emitting element 24 emits any of red-, green- or blue-lights and is aligned in a predetermined order in a matrix formation.

In the above construction, once the switching transistor 21 is "ON" state, then the picture signal is written in the storage capacitor 23 through the switching transistor 21. Therefore the gate electrode of the driver transistor 22 is kept in a voltage corresponding to the picture signal by the storage capacitor 23 even the switching transistor 21 is set to be "OFF" state. The driver transistor 22 is kept in a source follower mode which features constant current characteristics and the light-emitting operation is maintained since the current from the current supply line flows to the organic light-emitting diode that constructs the light-emitting element 24. For this case, the intensity of the emitted light depends on the data written in the storage capacitor 23. The cease of the emission is realized by setting the driver transistor 22 "OFF" state.

Figure 9:
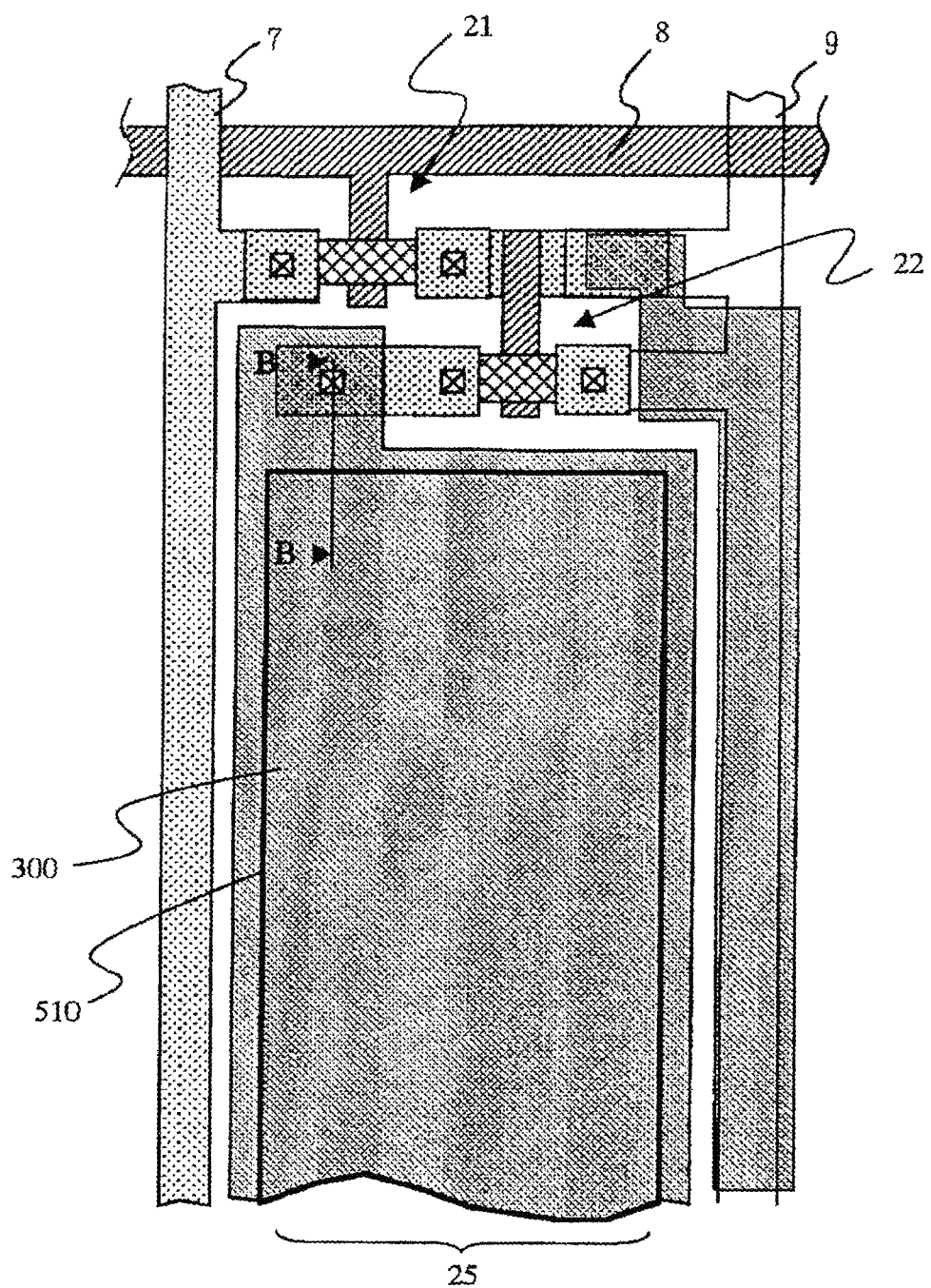
FIG. 9 is a layer drawing of the picture element of the embodiment of the display device according to the present invention.
Figure 10:
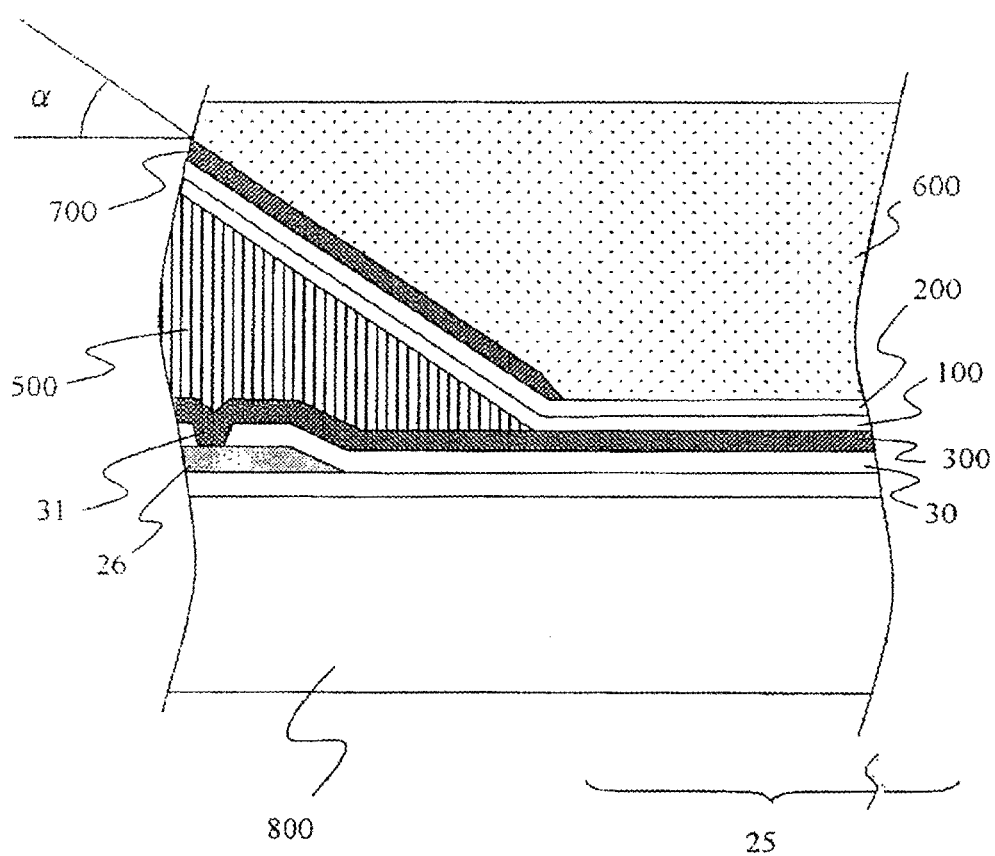
FIG. 10 is a cutaway view along B-B line shown in FIG. 9

We explain the construction of the display device regarding the first embodiment of this invention with referring to a combination of FIG. 9 and FIG. 10 and that of FIG. 1 and FIG. 2. FIG. 9 is a layer drawing of the picture element showing the constructing layers. FIG. 10 shows a cutaway view along the line B-B in FIG. 9. The display device in this embodiment is constructed as that driver elements (thin film transistors in this embodiment) as switching transistors and driver transistors and elements connected to those driver elements as gate lines, data lines, a common voltage line and storage capacitor are formed on a flat substrate 800 as glass and insulation layer 30 is formed thereover. On the insulation layer 30, a reflective electrode 300 that works as a cathode of the light-emitting element 24 is formed in a shape of an island and the reflective electrode 300 is connected to the drain electrode 26 of the driver transistor via a contact hole 31 opened in the insulation layer 30.

In this embodiment, the reflective electrode 300 functions as a cathode. For the cathode, the metals of low work function as aluminum, magnesium, magnesium-silver alloy; aluminum-lithium alloy, etc. can be used. Since the configuration of a single metal layer using as aluminum needs high driving voltage and the life-time of the display device is short, a ultra-thin film of Li compound (as lithium oxide Li2O, lithium fluoride LiF) formed between the reflective electrode and the organic layer may be used which equivalently works as aluminum-lithium alloy. Alternatively, the cathode surface contacting with the organic layer is doped with high reactive metal as lithium or strontium and then low drive voltage may be obtained. In addition, the reflective electrode is desired to be made of highly optical reflective material in order to obtain the high usage efficiency of the light for viewing image.

In the area on which the driver elements and signal lines are formed, a bank 500 which overlays these elements and lines and surrounds the flat area of the reflective electrode 300 is formed thereon. In this case, the bank 500 is formed to cover the contact hole 31. In other words, the contact hole is desired to be aligned and formed underneath the bank. This helps to be effective to realize higher intensity of light emission because the step difference exists on the contact hole 31 resulting in no use area against light emitting area and we can obtain the wider light-emitting area by arranging the no light emitting area under the bank area. Moreover, it is desirable that the bank is formed to overlay the peripheral part of the reflective electrode 300. Because the organic layer 100 and the transparent electrode 200 are cracked by the step difference of the reflective electrode 300 at the peripheral part so that the transparent electrode 200 is electrically broken and/or the reflective electrode 300 and the transparent electrode 200 are electrically shorted. Instead of these problems, the overlay forming of the bank, therefore, prevents such incidental troubles.

The bank 500 can be formed by patterning an insulator material with photolithography technology. Inorganic material as silicon oxide, silicon nitride or dielectric material such as acrylic resin and polyimide resin may be used. In addition, it is preferred that the height of the bank is more than a few micron meters in order to realize high external coupling efficiency since the dimension of the bank 500 determines the height of the tilted reflective surface 700 and the thickness of the optical waveguide layer 600. The organic material is realistic and preferred for such dimensional height of the bank formed in short time processing. The cross sectional view of the bank 500 has a trapezoidal shape so that the horizontal width is less while the height is farther from the substrate and the side surfaces of the bank has an arrangement into a tilted surface against the substrate surface. Moreover, the bank 500 may be made by other processes provided we can obtain the designed tilted surface as screen printing method and direct printing such as the ink-jet printing.

The organic layer 100 that has light-emitting layer emitting each of red, green and blue lights is patterned in each predetermined position for each picture element in a shape of an island. A transparent electrode 200 functioning as an anode is formed over the display portion 2. The transparent electrode material that has high work function, for example, ITO (Indium Tin Oxide) is preferable and IZO (Indium Zinc Oxide) is usable.

The transparent electrode 200 is connected with the current supply line. For the organic layer 100, a material that emits the light in a designed color is used and the construction of three layers as an electron transporting layer, a light-emitting layer and a hole transporting layer or two layers as using a material which supports both a light-emitting layer and an electron transporting layer and a hole transporting layer.

For a red light emitting material, for instance, we can use triphenyldiamine derivative TPD (N,N'-bis(3-methylphenyl)-N,N'-diphenyl-[1,1'-biphenyl]-4,4'-diamine) or α-NPD (4,4'-bis[N-(1-naphthyl)-N-phenylamino]biphenyl) and DCM-1(4-dicyanomethylene-6-(p-dimethylaminostyryl)-2-methyl-4-H-pyran) distributed Alq3 (tris(8-quinolinolate) aluminum) for the electron transporting light-emitting layer (dual usage for an electron transporting layer and a light emitting layer).

For green light emitting material, for instance, we can use triphenyldiamine derivative TPD or α-NPD for hole transporting layer and Alq3 or quinacridon-doped Alq3 or Bebq (bis(8-hydroxy quinolinate)beryllium) for the electron transporting light-emitting layer (dual usage for an electron transporting layer and a light emitting layer).

For blue light emitting material, for instance, triphenyldiamine derivative TPD, α-NPD for the hole transporting layer and DPVBi (4,4'-bis(2,2-diphenylvinyl)biphenyl) or a material consisting of DPVBi and BCzVBi (4,4'-bis(2-carbazolevinylene)biphenyl) or a material doped with distyrylallylene derivative as a host and distyrylamine derivative as a guest for the light emitting layer and Alq3 for the electron transporting layer. We can use Zn (oxz)2 (2-(O-hydroxyphenyl)-benzoxazole zinc complex) for the electron transporting light emitting layer (dual usage for an electron transporting layer and a light emitting layer).

Moreover, we can use materials of polymer system in stead of the above material of a low molecular-weight system. As for the polymer base materials, we can use multiple-layer film of PEDT/PSS (a mixed layer of Polyethylene dioxy thiophene and Polystyrene sulphonate) and PPV (poly(p-phenylene vinylen)) for the hole transporting layer and the light emitting layer. Also we can use green ink blended PPV for green color light emission, rhodamine 101 blended green ink as a dopant for red-color light emission and F8 (Poly (dioctylfluorene)) for a blue color light emitting layer. In addition, F8 can function as an electron transporting layer. We can use dye containing polymer such as PVK (poly(N-vinylcarbazole)). Each layer of the multiple layer film is in the order of several tens of nano meters which is less than the wave length of the light.

As for the pattering of the organic layer 100 in each predetermined position for each picture element in a fashion of an island, we can use a published technology as pattered-film forming technology used for deposited organic layer through shadow masks (for instance, S. Miyaguchi, et al.: "Organic LED Fullcolor Passive-matrix display", Journal of the SID, 7, 3, pp 221-226 (1999)). In this process, the bank 500 can be used as a spacer of the shadow masks. When the organic layer 100 is composed by a material of a polymer system, we can use published ink-jet technology (for example, T. Shimoda, et al.: "Multicolor Pixel Patterning of Light-Emitting Polymers by Ink-Jet Printing", SID 99 DIGEST, 376 (1999)). In this process, the bank 500 functions as a torus isolating the picture element area.

A tilted reflective surface 700 is formed on the surface of the slope of the bank 500, which must be on the transparent electrode 200. The tilted reflective surface 700 is formed by high reflective metal such as aluminum, silver or chrome in the process of deposition through masks or in the photolithographic patterning processing. In addition, the following effect can be obtained when the tilted reflective surface is composed by a metal film. In general, the transparent electrode has higher electrical resistivity than a metal electrode. Therefore, the display device which has a large display size tends to have the voltage difference due to the electrical resistivity between the location close to the power supply and that far to it. Due to this voltage difference, the electric current flowing into the OLEDs composing the picture element differs among those close to the power supply and far from it, that results in the lack of uniformity in the Intensity of emitted light. For this problem, by forming the tilted reflective electrodes made of a metal that directly contacts to the transparent electrodes, the tilted reflective electrodes works as low resistive electrodes arranged thereon like as a meshed formation and the effect to suppress such lack of uniformity can be obtained.

For the tilted reflective surface 700, a multiple layered film using transparent dielectrics material such as silicon oxide, silicon nitride or titanium oxide may be formed for the reflective surface. For this case, we obtain a feature of loss less reflective surface against the light reflection but drawbacks as longer manufacturing process and the reflectivity dependence against the wavelength and the tilt angle that are subject to the issues to be studied. In the flat surface surrounded by the tilted reflective surface 700, an optical waveguide layer 600 is formed with a transparent material. The optical waveguide layer 600 should be made of lower refractive material than that of the transparent electrode 200. For this case, after liquid-repellent process to the tilted reflective surface 700 corresponding to the space between two picture elements, the optical waveguide layer 600 is formed by a film-forming of the material consisting of binder resin and solvent by means of spin coating, blade-coating, etc. and finish-processing in dry solidification. A selective film-forming by using ink-jet printing technology for such a flat surface 25 surrounded by the tilted reflective surface 700 can be used before the dry solidification.

The binder resin that composes the optical waveguide layer 600 is not necessary to be self-polymerizing but merely dry-solidified or polymerize-solidified after film coating. For this last material, higher durability and tighter contact than that for dry solidification. However, since polymerize-solidification needs UV light or X ray exposing or thermal heating, it is necessary to select the least damage process against the organic layer. For the optical waveguide layer 600, one of resins or mixed with the plurality of them as transparent acrylic resin, benzocyclobutene resin, polyimide resin, epoxy resin, polyacryl amide resin, polyvinyl alcohol, etc. or photoresist is usable. It is important to keep the height H2 of the optical waveguide layer 600 be less than the height H1 after solidification of the optical waveguide layer from the previous reason.

On the optical waveguide layer 600, a seal-off material 900 is set via the gap 950. For the seal-off material 900, a glass plate, plastic films which are enhanced for gas-barrier characteristics using inorganic layers, complex layered material using thin glass plates and plastic films. The seal-off material can keep a gap 950 against the optical waveguide layer 600 with using the bank 500 as a spacer and is fixed with the substrate 800 by adhesive seal material formed around the peripheral of the display portion 2 in a form of a frame. For this fixing, a gap 950 is filled with inert gases as nitrogen and kept as sealed-off by cementing the seal-off material 900 to the substrate 800 in air tight manner. In addition, desiccant is preferable to be put between the seal-off material 900 and the substrate 800 on necessity without degrading the display capability.

Figure 11:
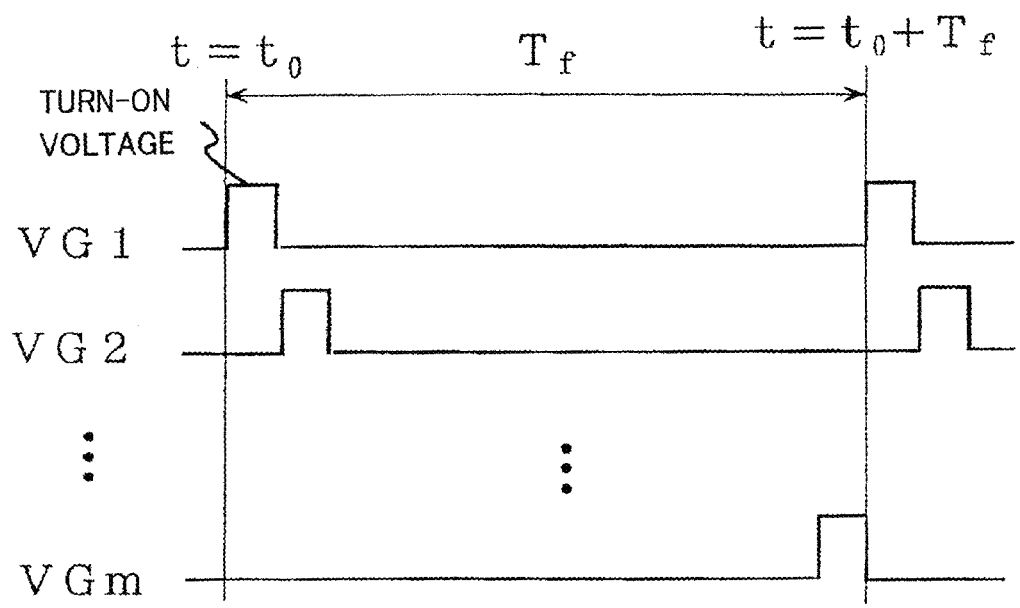
FIG. 11 is a timing chart of the applied voltage to the gate line.
Figure 12:
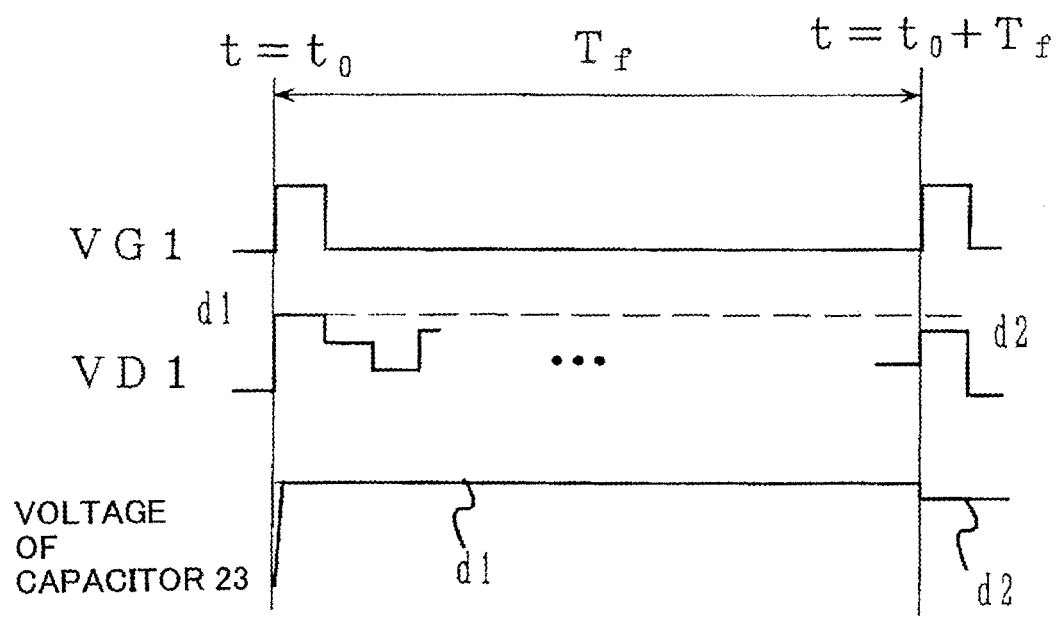
FIG. 12 is an explanatory schematic of an example of voltage status among the gate voltage, the data line voltage and the voltage in the storage capacitor.

Next, we explain the display operation of the display device 1 using FIG. 8, FIG. 11 and FIG. 12. FIG. 11 is a timing chart of the voltage VG1, VG2, . . . , VGm applied to the gate line G1, G2, . . . , Gm in order. FIG. 12 shows the voltage status of the gate voltage VG1, the data voltage VD1 and the voltage of the storage capacitor 23. As shown in FIG. 11, to the lines G1, G2, . . . , Gm, the VG1, VG2, . . . , VGm that turn-on the switching transistor 21 are applied to the gate line G1, G2, . . . , Gm in order. When the VG1, which turns on the switching transistor 21, is applied to the gate line G1 at the time $t=t_0$, the next turn-on voltage, after one vertical sweep of scanning with one frame term Tf, is applied to the gate line G1 at the time $t=t_0+Tf$. For this driving scheme, the time duration to apply the turn-on voltage to the one gate line is less than Tf/m. In general the time duration as 1/60 second is used for Tf time value.

Once a turn-on voltage is applied to a gate line, all transistors, that are connected to the gate line turn into turn-on status and a synchronous data voltages responding to picture signals are applied to the data lines. This is called as progressive line scanning method. Focusing to the picture element locating at the cross point of the first column and the first row, we explain the gate voltage VG1, the data voltage VD1 and the voltage status of the storage capacitor 23 with reference to FIG. 12. We assume the value d1 for the data voltage VD1 which is in synchronous to VG1 and the value d2 for the data voltage at the time of the next frame $t=t_0+Tf$. In this case, these data voltages are stored in the storage capacitor 23 while the turn-on voltage is being applied to the gate line G1 and these voltages are kept in about values for one frame term. These voltages determine the gate voltage of the driver transistor 22 and the current though the transistor is controlled by the gate voltage. The voltage and that given by these and common voltage line and the voltage Va applied to the transparent electrode determines a electric current which flows into the light-emitting element.

In other words, in synchronous to the turn-on voltage applied to the gate lines corresponding to the picture elements of which light intensity should be controlled, it is possible to control the light emission of the picture element by applying the voltage corresponding to the image information through the data lines. Therefore, it is possible to present a predetermined image by controlling the light emission from the plural picture elements that compose the display portion 2. Moreover, the response time of starting light emission after applying the voltage between the cathode and anode of the light-emitting element is generally less than 1 µs, therefore it is possible to display the picture image which is high-speed moving picture. Intense light emission is generally obtained for bright picture presentation by large current that flows through the organic light emitting diode but electric power consumption becomes large and life time of the diode (for example, defined as the life at the half intensity as the initial one) becomes shorter as au increasing of the current.

As described above, the present invention can use the light as the image light with good efficiency although the light is lost in the propagation for the past conventional technology. Therefore, the display devices that have more intensity of light, emission and the brighter picture presentation than those in the conventional technologies. The lower power consumption due to less current flowing into the light-emitting element and longer life time can be realized for the same intensity of light in a display device. Moreover in the display device according to the present invention, the optical waveguide layer is separated for each picture element, no picture degrading such as optical cross talk or blur of presentation due to no light is guided to other picture element, resulting into a display with clear images and high quality images.

Moreover, we have presented an embodiment wherein the light emitting area is on the flat plane of the substrate and has no step differences due to the presence of the driving devices or wiring lines thereon and wherein the step differences due to the driving devices and wiring lines are covered by the banks, however the embodiments are not confined in such configuration. For example, on the substrate on which the driving devices and the wiring lines are formed, all of the display portion including the step differences due to the driving device and wiring lines is covered by a planarizing layer consisting of an insulating material, on which flat surface those constructing elements of this invention as the reflective electrodes and banks or the like can be formed. For an organic planarizing layer material as acryl base resin, benzocyclobutene resin or polyimide base resign can be used. By the film forming method using spin-coating of these materials, the surface of these films can be easily flattened. By utilizing the surface on the wiring lines and driving devices after film forming by planarizing layer such as the light emitting area, then we can obtain extensive light emitting area even though we have no sufficient area for the flat area due to relatively large area necessary for wiring lines and driving devices against the physical size of the picture elements therefore we can realize bright display device.

In the above embodiment, we have explained the active matrix drive scheme, however this invention is not limited in this specific embodiment. For example, we can apply the present invention to a passive matrix driving display device where the electrodes are directly connected to the vertical scanning lines and horizontal scanning lines. Moreover the arrangement of picture elements can be either of a stripe arrangement, a mosaic arrangement or a delta arrangement and we can select an appropriate arrangement to be compliant to the requirement specifications of the display devices.

Figure 13A:
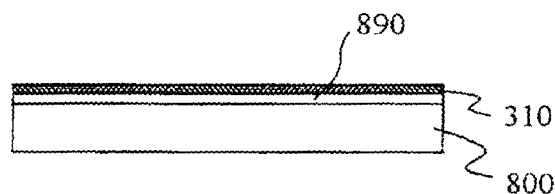
FIGS. 13A-13D schematically show the process to fabricate the bank of the display device according to the present invention.
Figure 13B:
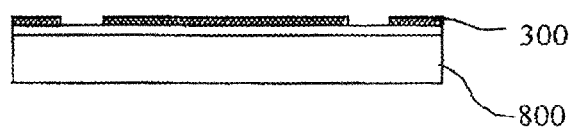
Figure 13C:
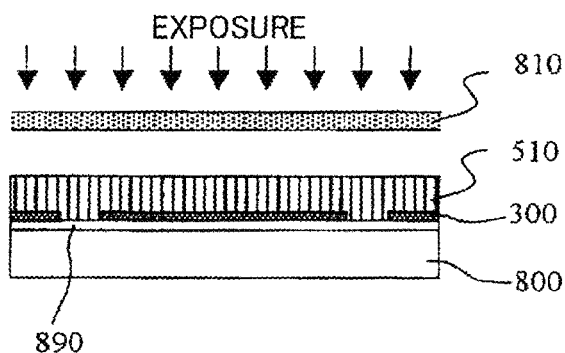

Next, we explain the manufacturing method of the first embodiment of this invention referring to FIGS. 13A-13D to FIGS. 16A-16C. FIGS. 13A-13D show the process to manufacture the banks in this manufacturing method of the display device according to the present invention. As shown in FIG. 13A, driving devices (such as thin film transistors, hereinafter) and wiring lines are formed on the substrate 800 and on top of the substrate an insulating layer 890 is formed and electrode layer 310 to be used for the reflective electrode 300 consisting of aluminum, magnesium, magnesium-silver alloy or aluminum-lithium alloy is formed. It should be noted that thin film transistors and wiring lines are omitted in the drawings. The electrode 310 for the reflective electrode 300 is electrically connected to the thin film transistors for drivers. Next, we coat the photoresist on the electrode layer 310 for the reflective electrode 300 and make patterns of photoresist by means of photo-lithography. We etch the electrode layer 310 by using the patterns of the photoresist and obtain the island-shaped reflective electrode 300 corresponding to the picture element, as shown in FIG. 13B after removing unnecessary photoresist.

Figure 13D:
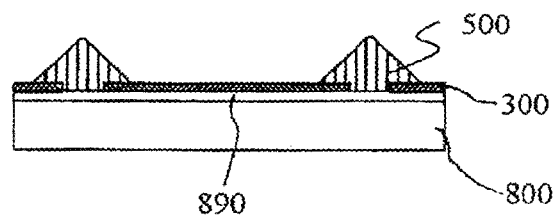

Next, we coat the photoresist in a certain predetermined thickness by spin-coating over on the substrate 800 on which the reflective electrode 300 has been formed. The thickness of the photoresist can be controlled by the viscosity by adjusting density of the resist since it is solved in a solvent and further controlled by the spinning rotation speed of the substrate in the film forming process. After coating the photoresist, photoresist film 510 is formed by heating and evaporating the solvent. The photoresist film 510 is exposed to the light through photo masks 810 (FIG. 13C) and is developed into the shape of banks 500 between the picture elements as shown in FIG. 13D. There are two kinds of photoresists; as negative one and positive one. Since no light-exposed portion is solved in the development for the negative type resist, the cross sectional shape of the photoresist tends to be rectangular or close to trapezoid. For the positive type resist, the cross sectional shape of the resist after development tends that the side surface of the resist is decreasing in accordance with the location of the side surface apart from the surface of the substrate. The selection should be done by considering the features such that the shapes closer to the desired ones are obtained.

For the negative type resist, we can use cinnamic acid base resist or rubber base resist as cyclized rubber added with bisazide compound for photosensitive radical. For the positive type resist, we can use a mixed material of naphtoquinonediazido compound for photosensitive agent and alkali-soluble phenolic resin. A concrete example of the positive type resist, there is a commercial product call "OPTOMER PC" (manufactured by JSR Corporation). This resist is a mixture of acryl base resin and naphtoquinonediazido compound. The viscosity is, for example for the use of "OPTOMER PC403", controlled as 3.5 µm thick film is formed when it is coated in the spinning speed of 700 rpm.

Figure 14:
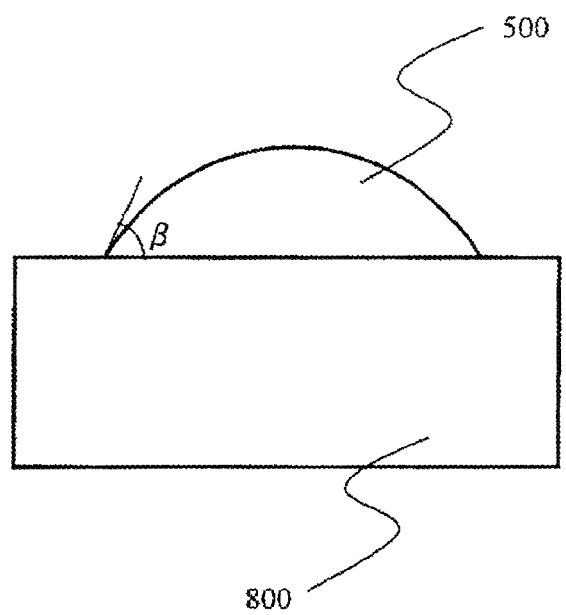
FIG. 14 is a schematic view explaining the bank of the display device according to the present invention.

For this case, we coat the photoresist on the substrate, dry by thermal heath and photo-expose by using a photo mask so that the areas of the banks are exposed. By these processes as exposure, development and heating, we obtain the bank 500 in a cross sectional shape as exampled in FIG. 14. The tilt angle β of the side surfaces of the bank at the nearest to the substrate surface is from 30° to 60° depending upon the process condition and it continuously decreases according to being apart from the substrate surface. For example, we obtain the angle β about 60° and the tilt angle is 20° at the height of 3 µm for the bank that has 3.5 µm height. This bank can be used for this embodiment. We can use photosensitive polyimide as a positive type photoresist product of which code is HD8010XF2 (Hitachi Chemical Co. Ltd.).

As for the photo mask 810, we use ultra-violet light-transmissive fused silica substrate on which shadow pattern is formed by the metal film. We can use a photo mask that has light control capability by controlling the thickness of the shadow metal or the area of the plural small open hole at the location of the shadow masks that are effective to the transparency change in continuous, manner. We have discussed the process to use photoresist for making the banks because we can manufacture the banks of several micron meters height in a practical processing time.

However this invention does not exclude inorganic material as silicon oxide or silicon nitride for the use of banks. For the case of using silicon nitride, we can form the bank by the silicon nitride layer formed by CVD (Chemical Vapor Deposition) on the substrate and patterned by etching through the resist pattern made photo-lithography technology and removing the unnecessary photoresist thereon. By varying the density conditions of the NH3 and SiH4 supplied for the film forming process, we can control the shape of the tilted surface, of the bank after etching due to multiple layers of silicon nitride with different film properties. Any forming method, for example screen printing method or direct drawing of the ink-jet, is exploited to form the bank 500 as far as the required tiled surfaces are obtained.

Figure 15A:
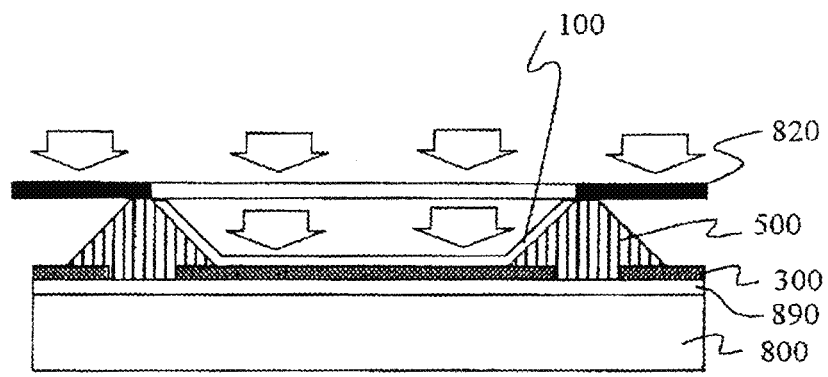
FIGS. 15A-15C schematically show the process to fabricate the organic layer of the device according to the present invention.
Figure 15B:
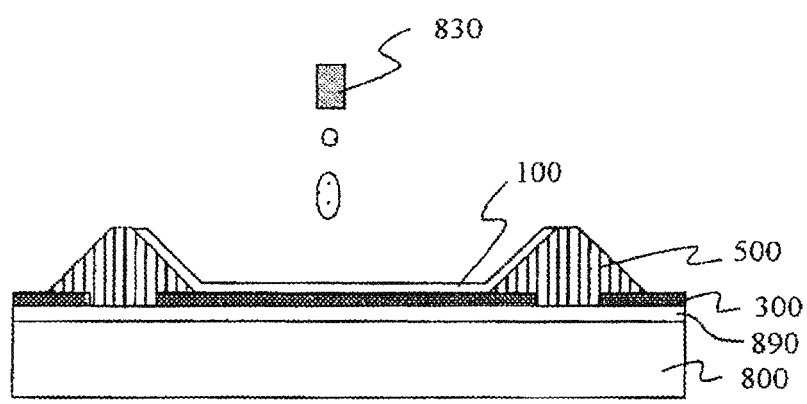
Figure 15C:
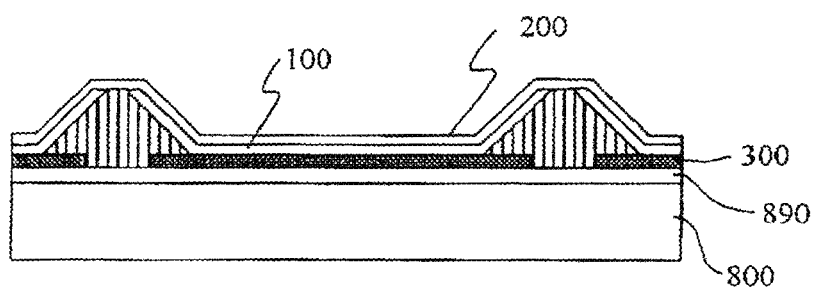

FIGS. 15A-15C show the process to manufacture the organic layer portion of the display device according to the present invention. We make the bank 500 in the previously described process, and then we form the organic layer 100 on the part of the tilted surface of the bank 500 and on the reflective electrode 300 in the area surrounded by the bank 500. As shown in FIG. 15A, the forming of the organic layer 100 is done by depositing the organic material via a metal mask which has the open areas corresponding to the locations of the light emitting areas. For this case, the bank can be used as a spacer to suspend the mask. For the case when the organic layer is polymer type, the film forming is done by blowing the solution of solvent and the organic material from the ink-jet head 830 using the control method with a piezo device, as so-called ink-jet patterning technology as shown in FIG. 15B. For this method, the banks 500 can work as dams to store the ink-droplet.

After forming the organic layer, the transparent electrode 200 is formed on all of the display portions. For the transparent electrode, electrically conductive transparent film as ITO or IZO can be used and it is formed by vacuum evaporation or sputtering process (see FIG. 15C). However, it is difficult to form low resistive transparent film by using the conventional deposition method and damages are made in the organic layer 100 resulting into degradation of the characteristics in the case of using sputtering method. Therefore an ion plating device or a counter target sputtering device, wherein plasma does not directly contact onto the surface of the substrate, is better to be used in forming the transparent electrode 200 in order to makes less damage as possible. We can form a thin metal deposition film through which the light transmits directly onto the organic layer before forming the transparent conductive film. We may exploit the transparent conductive film deposited on this thin metal deposition film for the transparent electrode. For this case, the thin metal deposition film works as a blocking layer, it is possible to reduce the damage onto the organic layer when the transparent conductive film. For this blocking layer, we can use the metal as gold, platinum or chrome that has a high work function in the thickness of about 10 nm.

Figure 16A:
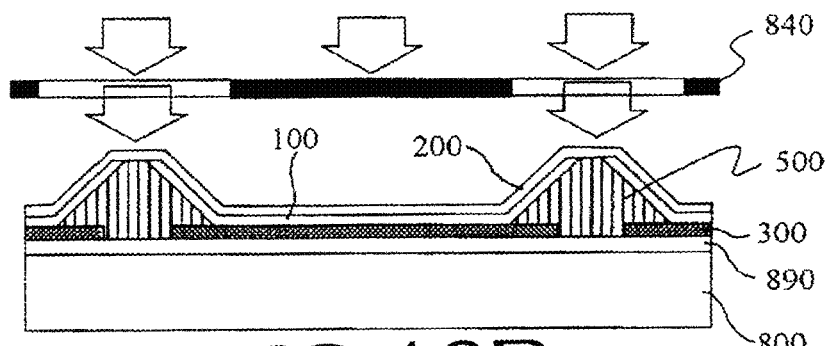
FIGS. 16A-16C schematically show the process to fabricate the optical waveguide layer of the device according to the present invention.
Figure 16B:
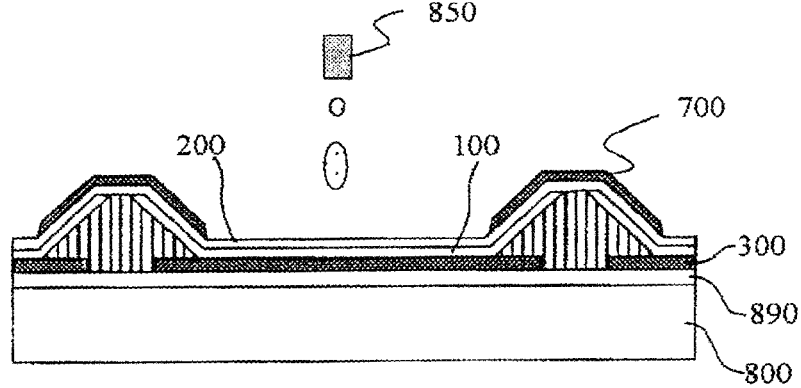
Figure 16C:
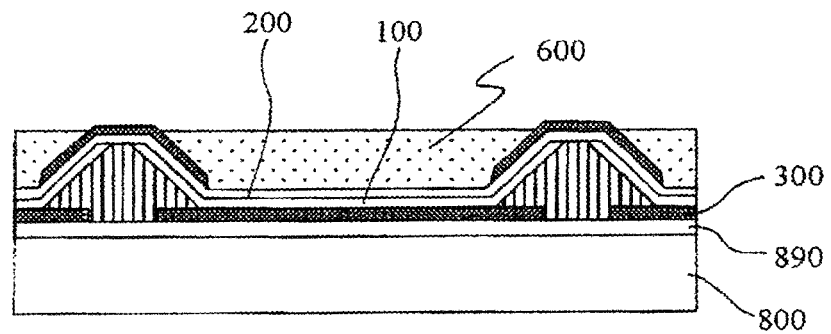

FIGS. 16A-16C show the process to manufacture the optical waveguide layer of the display device according to the present invention. As shown in FIG. 16A, we form the tilted reflective surface 700 by selectively deposited high reflective metal such as aluminum using a metal mask that has the open holes corresponding to the banks 500 made in the process described above. Afterwards, we blow the compound material for the optical waveguide layer to the basin area surrounded by the bank 500 through the ink-jet head 850 as shown in FIG. 16B. The compound material consists of solvent and the binder resin which is transparent for visible light. We form the optical waveguide layer 600 which is slightly lower than the top end of the tilted reflective surface as shown in FIG. 16C in such a way that the compound material of the optical waveguide layer is stacked up to the height similar to that of the bank or slightly lower than that of the bank, is kept for a mean time enough to get wet with the transparent electrode 200 and the tilted reflective surface 700 and to obtain leveling and then dried and solidified. We may form the predetermined optical waveguide layer by repeating to blow the compound material for the optical waveguide layer, dry and solidify.

For the binder resin to compose the optical waveguide layer 600, a binder resin that has no polymerization property but is merely dried for solidification is usable and another binder resin that is solidified by a polymerizing process after film forming is usable, as well. The resin that can be solidified by polymerizing process has tighter contact and higher durability than the simple dry and hardening process, however it needs an optimization of the process for, exposing to ultraviolet light or electron beam or that for heating in order to obtain the least damage to the organic layer.

We can use a resin or a complex mixture of resins from acrylic resin, benzocyclobutene resin, polyimide resin, epoxy resin, polyacryl amide resin, polyvinyl alcohol, etc. By using such material for the optical waveguide layer 600, it is possible to make an optical waveguide layer that has smaller refractive index than such transparent electrodes as ITO and IZO and larger one than the air.

As for forming the optical waveguide layer, the film forming of the optical waveguide layer compound material is done by coating over the substrate using a spin-coater drying for hardening besides selectively depositing the compound in the area of the basin surrounded by the banks by using ink-jet. In this case, the substrate is exposed to O2 plasma and then CF4 plasma after forming the tilted reflective surface but before forming the layer of the optical waveguide layer compound material. In this case, the tilted reflective surface made of aluminum which is only fluorinated has liquid-repellency and the transparent electrode which is not fluorinated keeps wettable surface characteristics to the optical waveguide layer compound material. Therefore the optical waveguide layer compound material stays on the area to which the transparent electrode surface expose and not on the tilted reflective surface. This results in the optical waveguide layers isolated by the tilted reflective surface for each of the picture element.

It is desirable that the optical waveguide layer is completely isolated by the tilted reflective surface, however each the isolated waveguide layer it connects to that on the adjacent picture element beyond the tilted reflective surface. For this case, in the area where the optical waveguide layer is thinnest, mostly at the ridgeline of the bank, the thickness of the optical waveguide layer is less than the visible light wavelength and waveguide modes are so limited that only little amount of lights leaks to the next picture element. Therefore, even though the optical waveguide layer has continuity to that in the area of the adjacent picture elements, the optical waveguide layer is practically isolated provided the thinnest optical waveguide layer is less than the visible light wave length. Therefore this invention does not necessarily exclude such continuity of the optical waveguide layer.

As shown in FIG. 1, the seal-off material is fixed with the substrate 800 with adhesive sealing cement formed in a frame shape around the peripheral area of the display portion by keeping the gap 950 between the seal-off material 900 and the optical waveguide layer 600 with the bank 500 as a spacer. The gap 950 has an equivalent refractive index to the air by filling the inert gas as nitrogen with the gap 950 between the seal-off material 900 and the substrate 800. As for the seal-off material 900, we can use that of transparent for visible light and gas-barrier capable plates such as a glass plate, a plastic film processed for gas barrier, a multi-layer with glass plates and the plastic films.

The Second Embodiment

Figure 17:
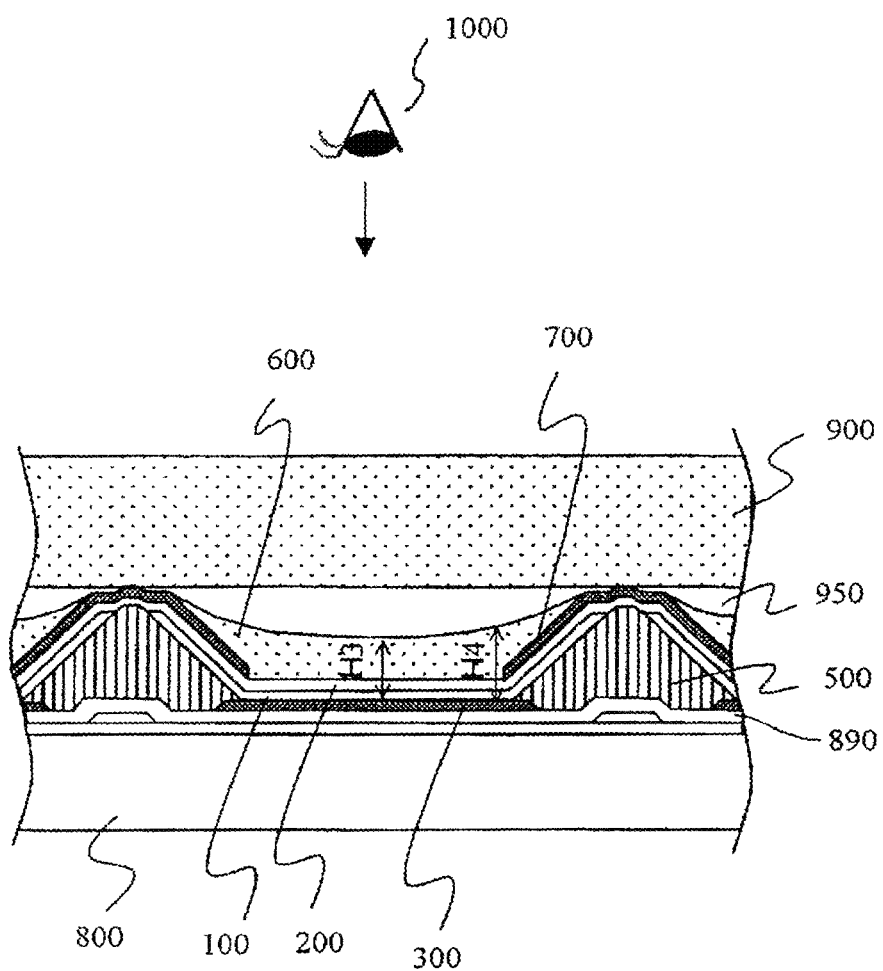
FIG. 17 is a cross sectional view of a picture element explaining the second embodiment of the display device according to the present invention.

Next, we will explain another embodiment of the display device regarding to this invention. FIG. 17 shows a cross sectional view of another embodiment of the display device. In this display device, the height H3 of the optical waveguide layer locating at the central area of the basin area surrounded by the bank 500 is continuously larger as being closer to the bank 500. Besides the height H4 of the optical waveguide layer 600 on the tilted reflective surface 700 is larger than H3, we will use the same signs and notations for the same portions and omit the detailed explanation.

For the optical waveguide layer 600 which satisfies the relation of these heights, we can form it by controlling the dry out speed of the coated optical waveguide layer compound material when we coat the optical waveguide layer compound consisting of binder resin and solvent with taking the boiling point and the vapor pressure of the solvent in the room temperature into account. In other words, we can obtain the optical waveguide layer in a form that the height is low in the central area surrounded by the bank and is high on the tilted reflective surface 700, in accordance with the volume shrinkage after coating the optical waveguide layer compound, leveling the coated film and drying for solvent evaporation. In this case, the surface of the optical waveguide layer 600 is not parallel but declines to the surface of the substrate.

Figure 18:
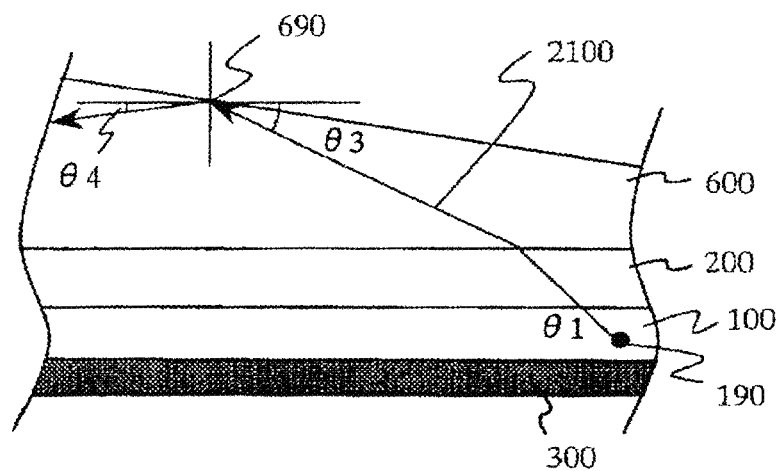
FIG. 18 is a schematic view explaining the effect of the optical waveguide layer in the second embodiment.
Figure 19:
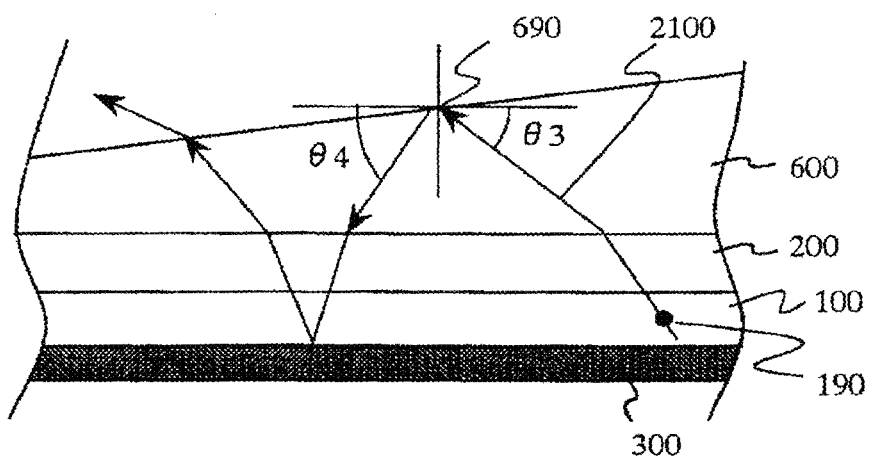
FIG. 19 is another schematic view explaining the effect of the optical waveguide layer in the second embodiment.

Next, we will explain the effect of the optical waveguide layer 600 described above. FIG. 18 and FIG. 19 show the cases of the optical waveguide layer 600 has the different height for each location, that is, the surface of the optical waveguide layer 600 is not parallel to the substrate. FIG. 18 shows the case where the height of the optical waveguide layer on the upper location of the light 2100 which is emitting the light at location 190 is lower than the height of the layer at the location 690 where the light 2100 reflects on the surface of the optical waveguide layer. We assume the incident angle and reflection angle of the light 2100 at the surface of the optical waveguide layer against the surface parallel to the substrate as θ3 and θ4, respectively. Then the relation θ3>θ4 is satisfied, the light reflected on the surface of the optical waveguide layer is more parallel to the substrate. Therefore, the times of reflecting on the reflective electrode 300 until the light traveling until reaching to the tilted reflective surface in the optical waveguide layer decrease and the light loss by absorbing the light at the reflective electrode, that results into improving the external coupling efficiency.

On the other hand, FIG. 19 shows the case where the height of the optical waveguide layer on the upper location of the light 2100 which is emitting the light at location 190 is higher than the height of the layer at the location 690 where the light 2100 reflects on the surface of the optical waveguide layer. We assume the incident angle and reflection angle of the light 2100 which is totally reflected at the surface of the optical waveguide layer against the surface parallel to the substrate as θ3 and θ4, respectively. Then the relation θ3<θ4 is satisfied, the light reflected on the surface of the optical waveguide layer is more vertical to the substrate. Therefore, the totally reflected light on the optical waveguide layer surface at the first time has the smaller incident angle when the light again incidents to the surface of the optical waveguide layer. If the incident angle is smaller than the critical angle, then the light comes out to an outer viewer before the light comes up to the tilted reflective surface. Therefore when the outer surface of the optical waveguide layer tilts to the substrate, higher external coupling efficiency is obtained than in the case where the optical waveguide layer is parallel to the substrate.

The Third Embodiment

Figure 20:
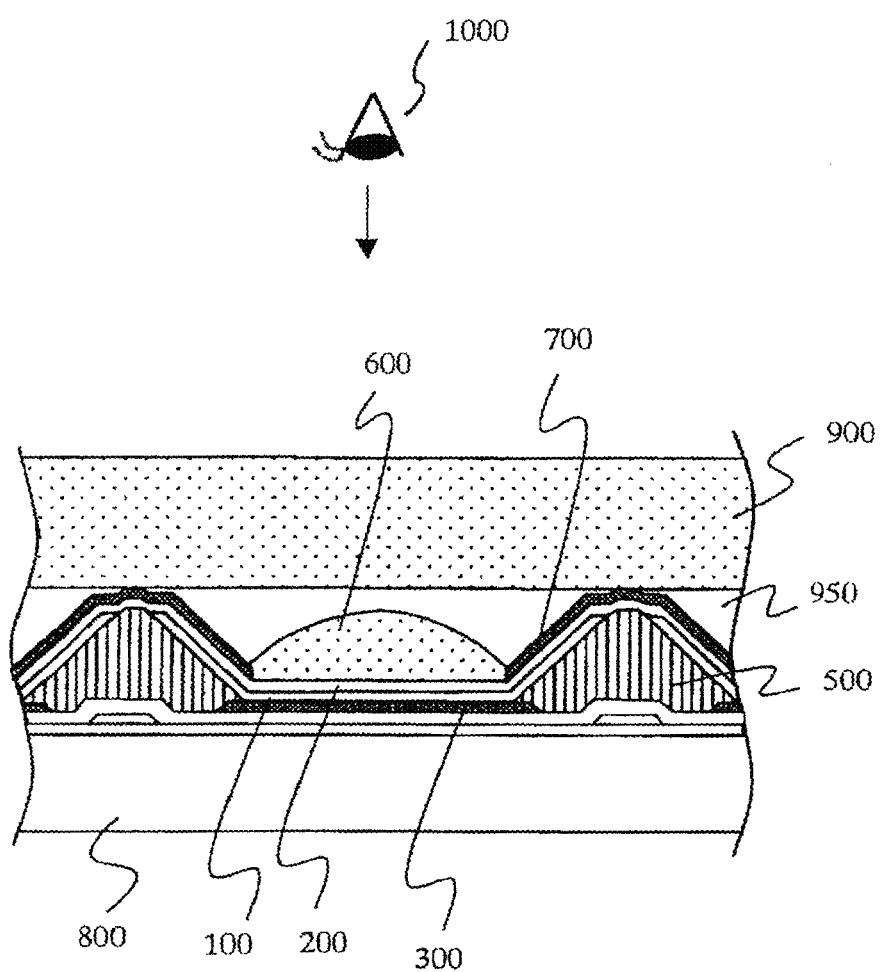
FIG. 20 is a cross sectional view of a picture element explaining the third embodiment of the display device according to the present invention.

Next, we will further explain another embodiment of the display device regarding to this invention. FIG. 20 shows a cross sectional view of a picture element in this another embodiment. For this embodiment of the display device, the thickness of the optical waveguide layer has the maximum at the center of the area surrounded by the bank 500 and is continuously less as being closer to the bank. Since the fundamental construction is same as the embodiment described above besides the shape of the optical waveguide layer is convex, we mark with the same signs and notations to the same portions and avoid the explanation. This shape of the optical waveguide layer is made by making the tilted reflective surface 700 liquid-repellent and the transparent electrode 200 exposing to the optical waveguide layer liquid-wettable before coating the optical waveguide layer compound material consisting of binder resin and solvent. As a concrete process, the substrate is exposed to oxygen plasma and CF4 plasma in order before coating the optical waveguide layer compound material.

In this case, if the tilted reflective surface is made of aluminum then the surface is fluorinated and has liquid (water)-repellent characteristics, however the transparent electrode is not fluorinated and keeps wettable surface characteristics against the optical waveguide layer compound material. In stead of these processes, we can make the tilted reflective surface liquid-repellent and the transparent electrode exposing to the optical waveguide layer selectively liquid-wettable by coating all over the substrate with a transparent wettability-converted layer which is not shown in the figures. The wettability-converted layer can be formed by coating a solution in which the binder resign, the photocatalyst and the necessary additives are dispersed, drying and fixing the photocatalyst in the hardened resin. If the thickness of the wettability-converted layer is large, then it allows guiding the light and causes the optical cross-talk by light leak to other picture elements. Therefore it is desirable that the particle size of the photocatalyst should be less than 10 nm and the layer being less than 300 nm. We can exploit titanium oxide for the photocatalyst and organosiloxane polymer for the binder resin. After forming the wettability-converted layer and photo-exposing with the tilted reflective surface blocked off from the exposure and the transparent electrode exposing to the optical waveguide layer through the photo mask, the exposed wettability-converted layer turns to be high liquid-wettability and the non-exposed one maintains to be liquid-repellent.

After making the tilted reflective surface 700 liquid-repellent and the transparent electrode 200 exposing to the optical waveguide layer liquid-wettability, the coated optical waveguide layer compound material turns into a convex shaped optical waveguide layer such that the thickness of the optical waveguide layer is the maximum at the center of the area surrounded by the bank and is continuously decreasing in closing to the bank 500. For this construction, improvement of the external coupling efficiency can be expected due to the slope of the optical waveguide layer 600 against the substrate surface.

The Fourth Embodiment

Figure 21:
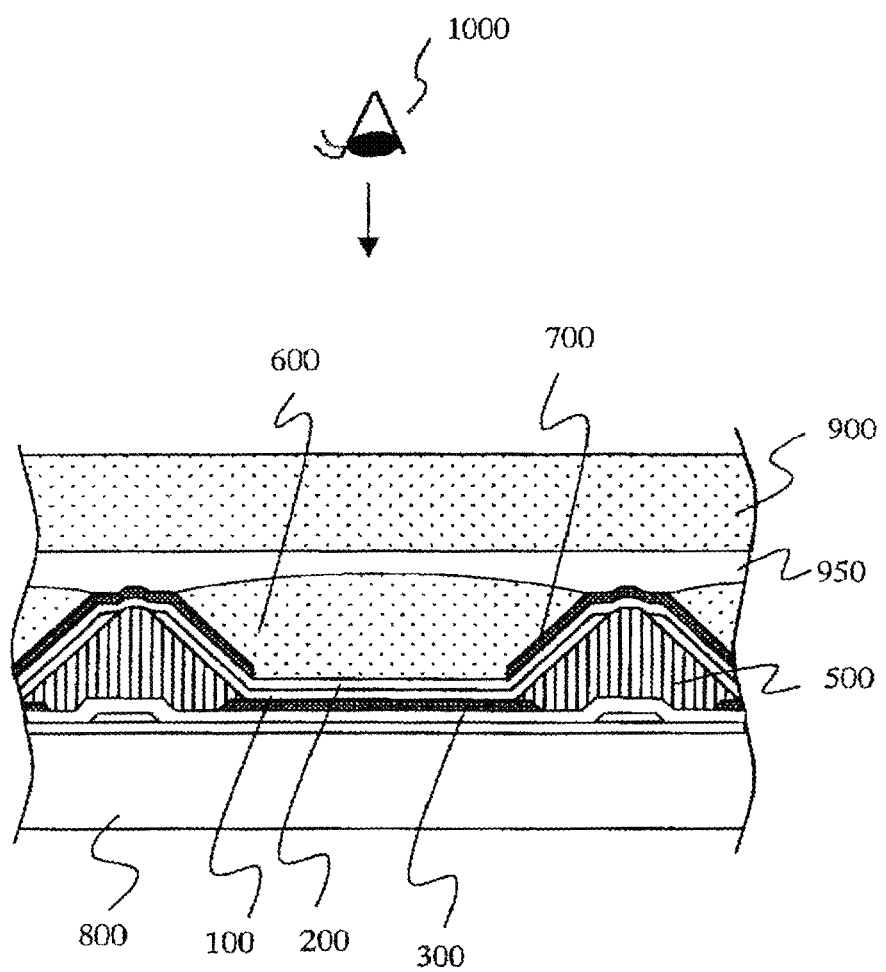
FIG. 21 is a cross sectional view of a picture element explaining the fourth embodiment of the display device according to the present invention.

Next, we further explain another embodiment of the display device regarding to this invention. FIG. 21 shows the cross sectional view of a picture element that explains another embodiment. This embodiment has an increased optical waveguide layer and the maximum height of the layer is higher than the height of the bank therefore the fundamental construction is same as the embodiment described above. From this reason, we use the same signs and notations for the same portions and omit detailed explanations. In this embodiment, it is possible to make only the ridgeline of the bank liquid-repellent and the other parts including the tilted reflective surfaces selectively high liquid-wettable by blocking the light exposure onto the ridgeline of the bank when the light is exposed onto the wettability-converted layer. In this embodiment, improvement of the external coupling efficiency can be expected due to the slope of the optical waveguide layer 600 against the substrate surface. In addition, a display device that has high intensity of the light emission normal to the front surface is realized due to the focusing effect of the optical waveguide layer as the convex surface shape of the optical waveguide layer. However, the bank 500 cannot be used as a spacer between the substrate 800 and seal-off material when they are tightly cemented. Therefore, we can use an adhesive seal material including beads or small rods pasted at the peripheral area of the display portion in a shape of a frame to such area and then the substrate 800 and the seal-off material 900 are fixed in nitrogen gas filled therebetween.

The Fifth Embodiment

Figure 22:
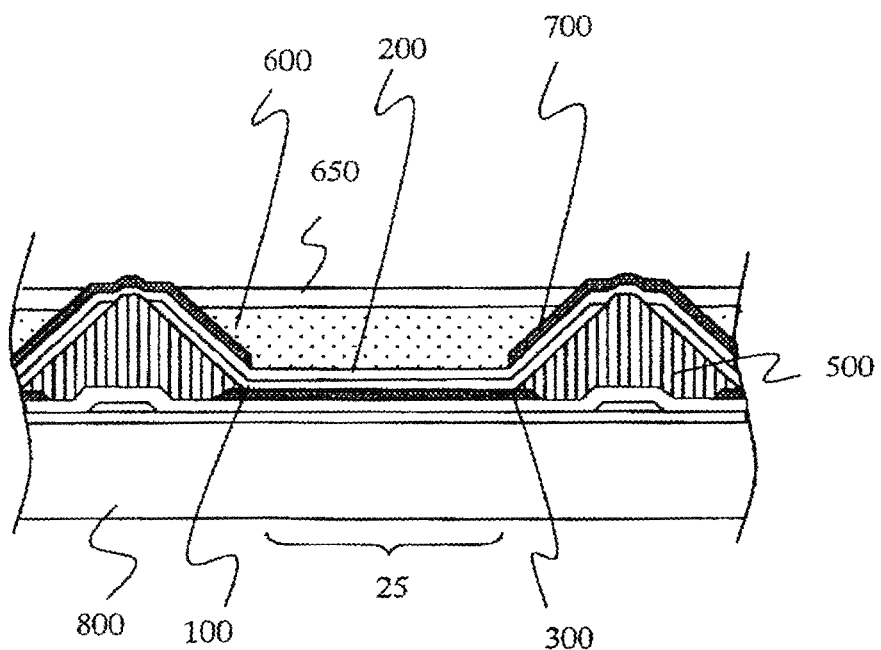
FIG. 22 is a cross sectional view of a picture element explaining the fifth embodiment of the display device according to the present invention.

Next, we explain another embodiment of the display device regarding to this invention. FIG. 22 shows a cross sectional view of the picture element of the display device regarding to this invention. This embodiment is the one wherein a modification is applied to the embodiment explained in FIG. 1 such that the seal-off material 900 is replaced by an optical waveguide layer 650 (called a gas-barriering optical waveguide layer, hereinafter) that is transparent and high dense and has high gas-barriering characteristics and that is further formed on the optical waveguide layer 600. Since the other constructions are same as the above embodiment, we use the same signs and notations for the same portions and omit detailed explanations. For the gas-barriering optical waveguide layer, we can use silicon nitride, titanium oxide and we optimize the condition such as the gas flow rate in case of using chemical vapor deposition method by which we obtain dense film forming as possible. We form a multi-layered gas-barriering layer in stead of a single layer and moreover we optically isolate the layer on each of the picture elements by using photo-lithography technology on necessity. Being same as the above embodiment, the external coupling efficiency is improved and the display device that presents a distinct picture quality and has no optical cross talk, is realized. Especially, there is a merit that a thin and light display device is realized since no seal-off material is used.

The Sixth Embodiment

Figure 23:
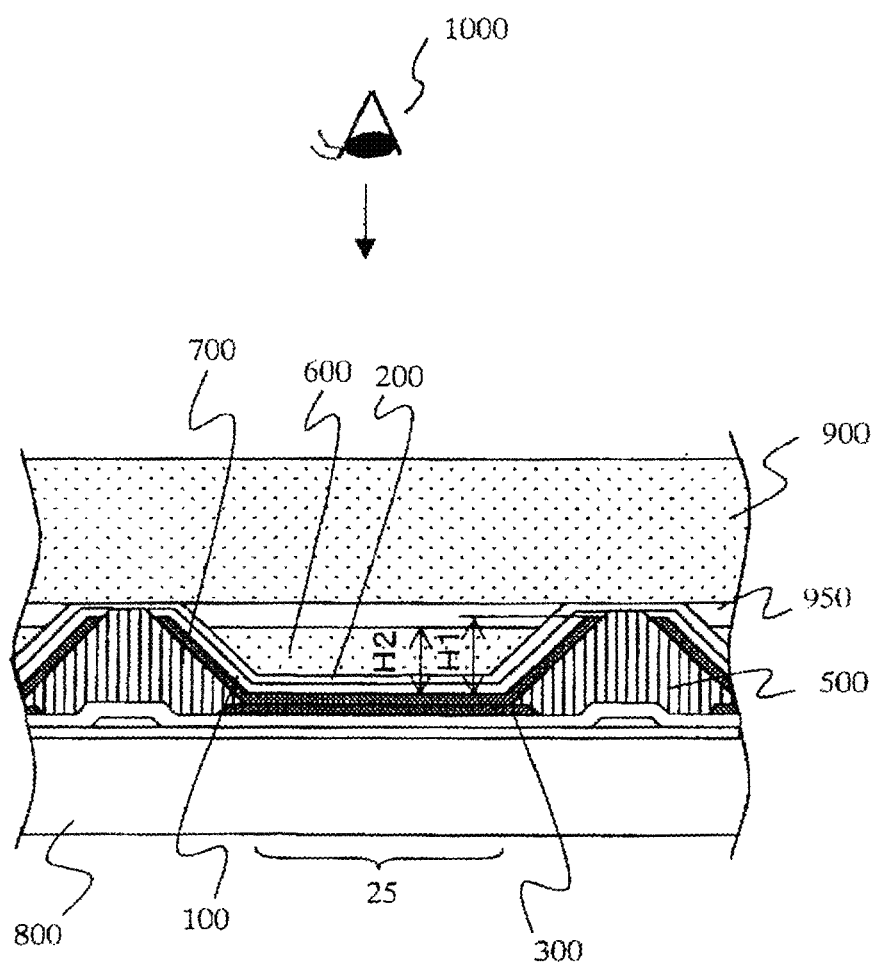
FIG. 23 is a cross sectional view of a picture element explaining the sixth embodiment of the display device according to the present invention.

Next, we explain another embodiment of the display device regarding to this invention. FIG. 23 shows a cross sectional view of the picture element of the display device regarding to this invention. This embodiment is the one wherein a modification is applied to the embodiment explained in FIG. 1 such that a tilted reflective surface 700, which has a reflective electrode function as well, is formed on the reflective electrode 300 and the slope surface of the bank 500 before forming the organic layer 100 and the organic layer 100, transparent electrode 200 and the optical waveguide layer 600 are formed thereon. Since the other constructions are same as the above embodiment, we use the same signs and notations for the same portions and omit detailed explanations. We explain the fabrication process of the embodiment shown in FIG. 23 in referring to FIGS. 24A-24C, FIGS. 25A-25C and the drawing of the previous embodiment. FIGS. 24A-24C and FIGS. 25A-25C are process drawings that explain the manufacturing method of another embodiment shown FIG. 23 regarding to this invention.

Figure 24A:
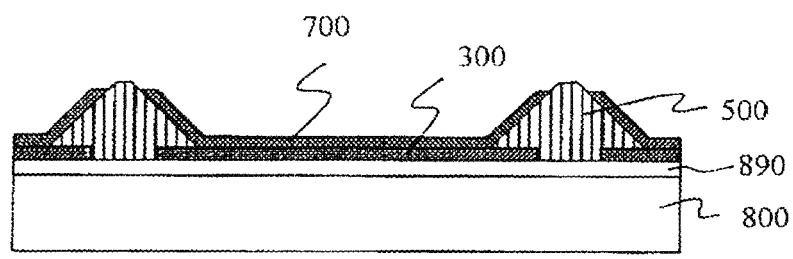
FIGS. 24A-24C schematically show the fabrication process of the display device regarding the sixth embodiment shown in FIG. 23.

The process for this embodiment is same as the previous embodiment up to the step wherein driver elements and wiring lines are formed and the island-shaped reflective electrode 300 consisting of aluminum, magnesium, magnesium-silver alloy or aluminum-lithium alloy and banks 500, that correspond to the picture element, are constructed on a substrate 800 with an insulating layer 890 on the upper surface. In the next step, we form a layer consisting of reflective metal material similar to the reflective electrode 300 over all surface of the display portion and then we construct the island-shaped tilted reflective surface 700, that corresponds to the picture element, on the reflective electrode 300 and the slope surface of the bank 500 by applying photolithography technology and etching as shown in FIG. 24A. Therefore, the tilted reflective surface 700 and the reflective electrode 300 are electrically connected and then the tilted reflective surface 700 works as a reflective electrode.

Figure 24B:
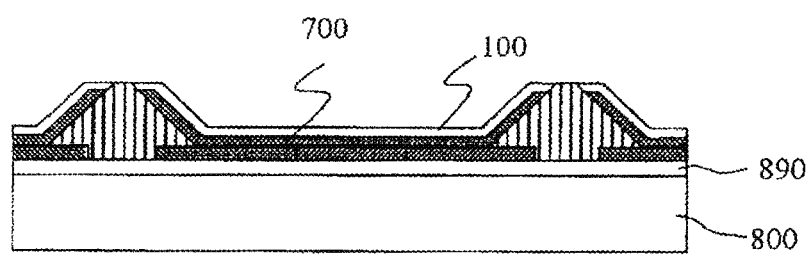

In the next step, as similar to the above embodiment explained by using FIGS. 15A-15C, the organic layer 100 is formed by selective deposition through masks or selective ink-jet patterning. In this case, the organic layer 100 is necessary to be formed in an extensive area so that it completely covers the edges of the tilted reflective surface 700 (as shown in FIG. 24B). Because a failure is caused by the electrical shortage between the tilted reflective surface and the transparent electrode 200 formed on the organic layer 100 if the edge of the tilted reflective surface is unconcealed.

Figure 24C:
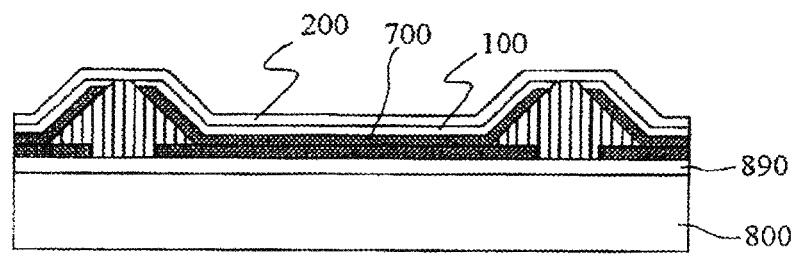

In the next step, the transparent electrode 200 is formed all over the display portion as shown in FIG. 24C. We can use ITO or IZO for the transparent electrode as described in the above embodiment and we can form it in the same method used for such embodiment. As further in FIG. 25A, we coat the wettability-converted layer on necessity all over the display portion. The wettability-converted layer is the layer for which we can change the wettability of a selectively predetermined area as liquid-repellant to liquid-wettable or vis-a-vis. We can use a film consisting of photo-catalyst and binder resin. For this case, the wettability-converted layer can be formed by coating a solution in which the binder resign, the photocatalyst and the necessary additives are dispersed on solvent, drying and fixing the photocatalyst in the hardened resin. If the thickness of the wettability-converted layer is large, then it allows guiding the light and causes the optical cross-talk by light leak to other picture elements. Therefore it is desirable that the particle size of the photocatalyst should be less than 10 nm and the layer be less than 300 nm. We can exploit titanium oxide for the photocatalyst and organosiloxane polymer for the binder resin. After forming the wettability-converted layer and photo-exposing through a photo mask 870, the exposed wettability-converted layer turns to be high liquid-wettability and the non-exposed one maintains to be liquid-repellent.

Figure 25A:
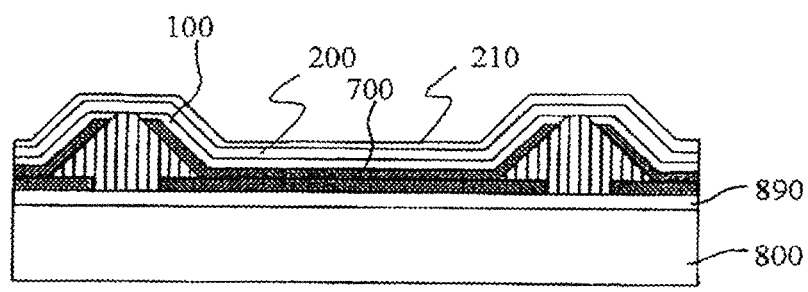
FIGS. 25A-25C schematically show the fabrication process of the display device regarding the sixth embodiment shown in FIG. 23.
Figure 25B:
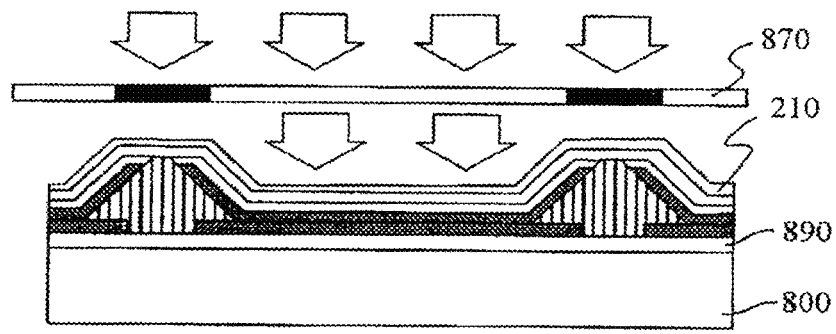
Figure 25C:
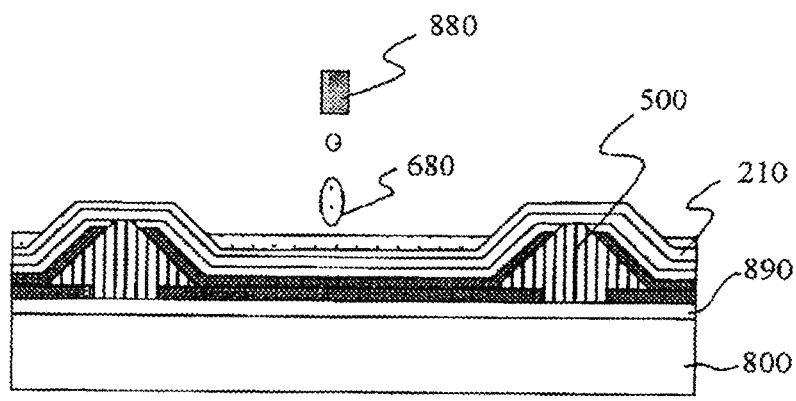

Therefore, the ridgeline of the bank 500 corresponding to the isolation gap between the picture elements maintain liquid-repellency and the other portion turns to be highly liquid-wettable after light-exposing to the wettability-converted layer through a photo mask 870 which blocks the light for the ridgeline of the bank 500 corresponding to such isolation gap and lets the light transmitting to other portions (as shown in FIG. 25B). In the next step, the optical waveguide layer compound material 680 is blown onto the basin area surrounded by the bank 500 from the ink-jet head 880 as shown in FIG. 25C. As same as the above embodiment explained in reference to FIG. 16, the optical waveguide layer compound material at least consists of solvent and binder resin which is transparent to the visible light. The optical waveguide layer compound material is stacked up to the level similar to the height of the tilted reflective surface 700. In this case, the blown optical waveguide layer does not stay on the ridgeline of the bank 500 and to moves to a puddle in the basin area surrounded by the bank 500. After we keep the blown optical waveguide layer compound material to obtain enough leveling, then we form the optical waveguide layer 600 which is optically isolated on each picture element by making the level lower than the upper edge of the tilted reflective surface 700 after dry and solidification. In addition, we can form the desired construction of the optical waveguide layer not only by a single process of blowing the optical waveguide layer compound material, drying and solidifying but by repeating such process.

As the next step, we fix the seal-off material 900 with the substrate 800 by adhesive seal material formed around the peripheral of the display portion in a form of a frame in a status that a gap 950 between seal-off material 900 and the optical waveguide layer 600 is kept by the bank 500 as a spacer. The gap 950 has an equivalent refractive index to the air by filling the inert gas as nitrogen between the seal-off material 900 and the substrate 800. In this embodiment, as same as the above embodiments, being different to the conventional technology wherein the light propagate in parallel to the substrate and then is lost in decay, the light is guided by the optical waveguide layer 600 to the tilted reflective surface 700 and then change the direction of the propagation by the reflection at the tilted reflective surface 700 and is used as an effective display image light to the viewer resulting into the improvement of the external coupling efficiency. Since the optical waveguide layer 600 is completely isolated, the light emitted from an organic layer of a certain picture element does not, propagate in other different picture elements and no picture quality problem as optical cross-talk or blur of presentation occurs, that results in realizing a display device that has high quality picture image. Moreover, in this embodiment, the tilted reflective surface 700 does not only work as a reflection surface but reflective electrode of OLED consisting of the reflection electrode, the organic layer 100 and transparent electrode 200. Therefore, the slope surface of bank 500 is used for the emission area as well as the flat surface 25 therefore the relatively extensive emission area in comparison to the embodiment shown in FIG. 1 is used and brighter display device is obtained on the basis of the same size of picture element.

Figure 26:
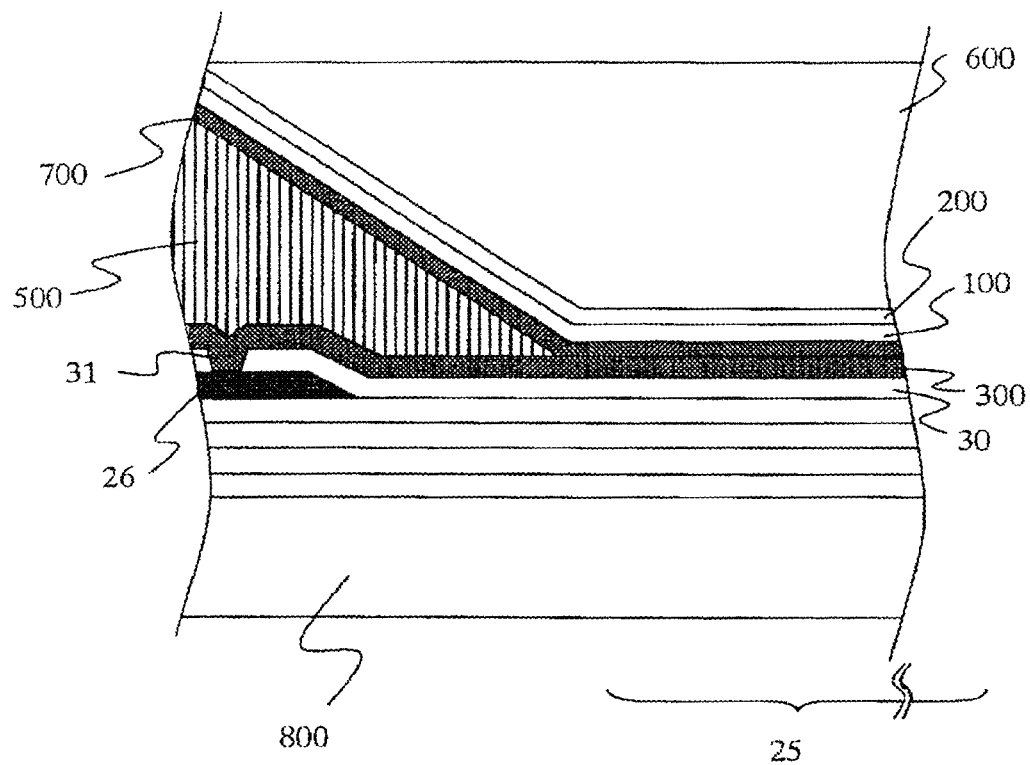
FIG. 26 is a cross sectional view of the picture element explaining the six embodiment of the display device according to the present invention.

FIG. 26 shows a cross-sectional view of the display device of an embodiment of this invention. The reflective electrode 300 electrically connects with the driver element on the area covered by the bank 500 as same as in the above embodiment. In other words, the electrode 26 of the driver transistor and the reflective electrode 300 is connected through the contact hole 31 made in the insulation layer 30. The contact hole 31 locates underneath the bank 500 and the tilted reflective surface 700. This implies that the contact hole area which cannot be used as a light emitting one is kept under the tilted reflective surface and the other area that emits the light is obtained as the light emitting area. This construction is efficient for realizing highly intense of the light emission.

The Seventh Embodiment

Figure 27:
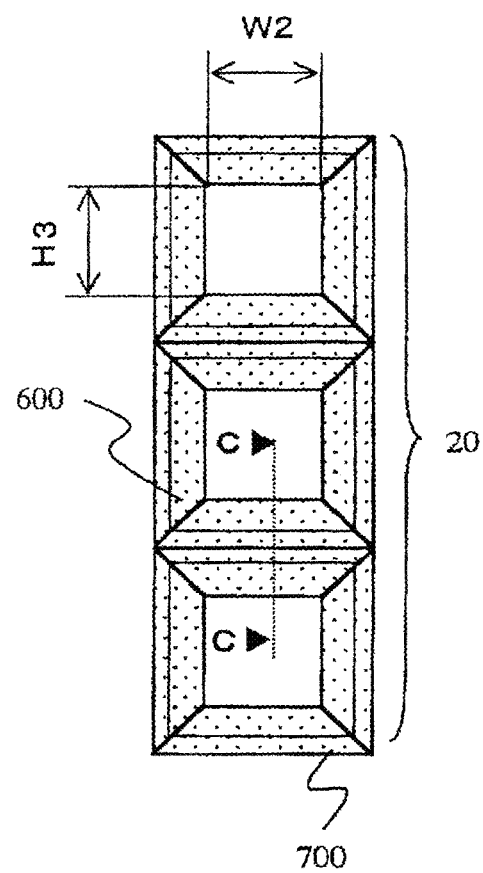
FIG. 27 is a plan view of a picture element explaining the seventh embodiment of the display device according to the present invention.

Next, we explain another embodiment of this invention. FIG. 27 shows a planar view of the display device of an embodiment of this invention. A unit picture element is shown as one of additive primary colors given by a red-color emission pixel, a green-color emission one and blue-color emission one therein. The pixel in this embodiment is constructed as the picture element 20 of the display device explained in referring to FIG. 1 and FIG. 2 is separated by the tilted reflective surface 700 and the bank 500 into a plurality of the areas for each of such pixel. Since the other constructions are same as the above embodiment, we use the same signs and notations for the same portions and omit detailed explanations.

In the display device for this embodiment, a picture element is segregated into a plurality of light emitting areas and we can control the viewing angle characteristics of the device by changing the relation between the size of the area and the height of the optical waveguide layer 600. This is, as described above, from the fact that the height of the tilted reflective surface and the thickness of the optical waveguide layer 600 against the size of the light emitting area influence to the external coupling efficiency. In other words, the longer the width of the light emitting area against a certain height of the tilted reflective surface and a certain thickness of the optical waveguide layer is formed, then the smaller the external coupling efficiency and reversely the shorter the width of the light emitting area, the larger the external coupling efficiency and the wider viewing angle are obtained. For the case of the above embodiment explained in referring to FIG. 2, the viewing angle for the horizontal orientation becomes larger than that of vertical orientation against the drawing plane. On the other hand, the display device that has same viewing angle characteristics for vertical orientation and horizontal orientation is realized by segregating the light emitting area of a picture element into a plurality of light emitting areas and making the length H3 in the vertical orientation same as the length W2 in the horizontal orientation. Especially in this invention, the external coupling efficiency can be larger, regardless to the size of the picture elements, than that in the case of using non-segregated picture element by segregating the picture element into a plurality of light emitting areas since we can shorten the width of the light emitting area against the height of the tilted reflective surface and the thickness of the optical waveguide layer. Therefore, a brighter display device is realized in comparison to other ones which consume the same electric power.

Figure 28:
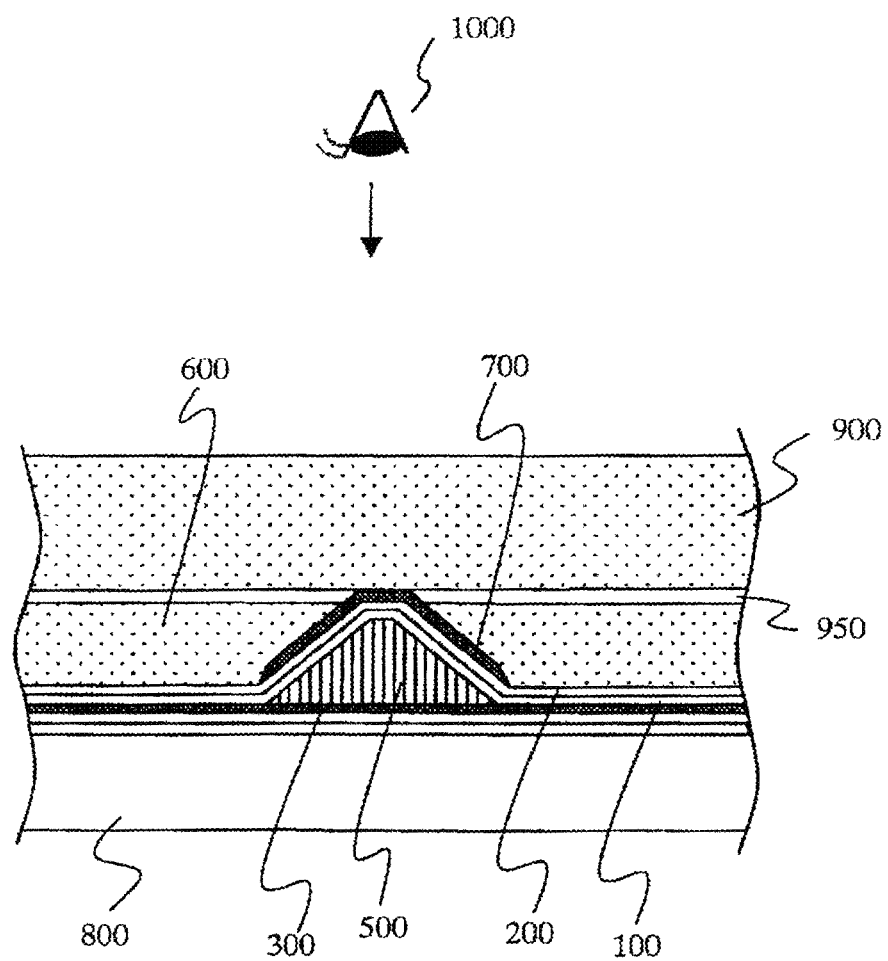
FIG. 28 is a cutaway view along C-C line shown in FIG. 27.

FIG. 28 shows the cutaway view along the line C-C of an embodiment shown in FIG. 27. A picture element in this embodiment is segregated into a plurality of areas by the bank 500 as described above. In order to suppress the increase of the defective fraction due to the increase of quantity of the driver elements, these segregated areas corresponding to a picture element are driven by a pair of driver elements of which configuration does not complicate the circuitry. For this purpose, the reflective electrode 20 is not segregated and a single island-shaped reflective electrode 300 is made for a single picture element 20. Therefore, the bank 500 that segregates the picture element into a plurality of areas is formed on the reflective surface 300 as shown in FIG. 28. For this case, since the reflective electrode 300 connects to other portion of the electrode on the flat surface under the bank 500, therefore no failure due to the break by the step difference occurs. Moreover, the transparent electrode 200 is hard to be broken at the ridge of the bank 500 since the tilted reflective surface 700 that works as an electrode is stacked on the transparent electrode.

Figure 29:
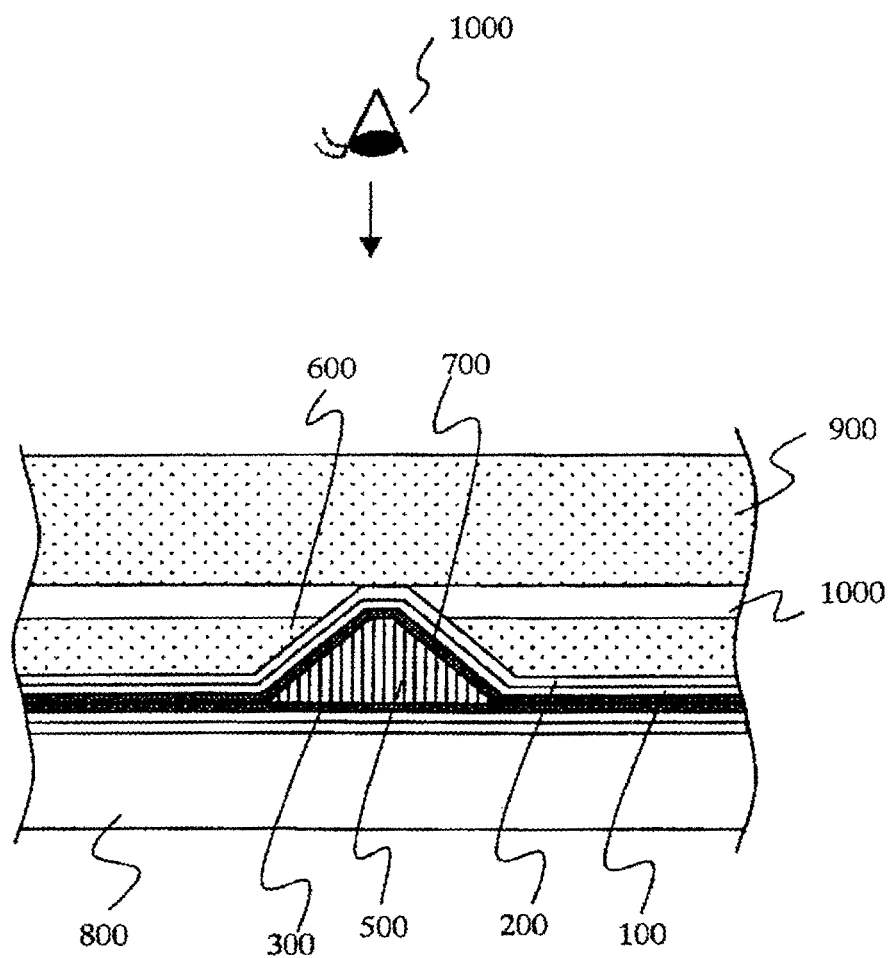
FIG. 29 is a cutaway view along C-C line shown in FIG. 27 wherein the sixth invention shown in FIG. 23 is applied to the invention embodied as shown in the FIG. 27.

FIG. 29 shows the cutaway view along the line C-C for an embodiment shown in FIG. 27 for the case of the embodiment shown in FIG. 23. For this case, the reflective electrode is not segregated, a single island-shaped reflective electrode 300 is made for a single picture element 20 and the bank 500 that segregates the picture element into a plurality of areas is formed on the reflective electrode 300 as shown in FIG. 29. Therefore no breaking of electrode occurs due to the step difference by the bank 500 since the reflective electrode 300 connects other portions of the electrodes on the flat surface. Moreover, the shape of the pixels segregated from a picture element can be any one as a polygon as a triangle and a hexagon, an ellipsoid or a circle as far as we can obtain the desired viewing angle characteristics.

The Eighth Embodiment

Figure 30:
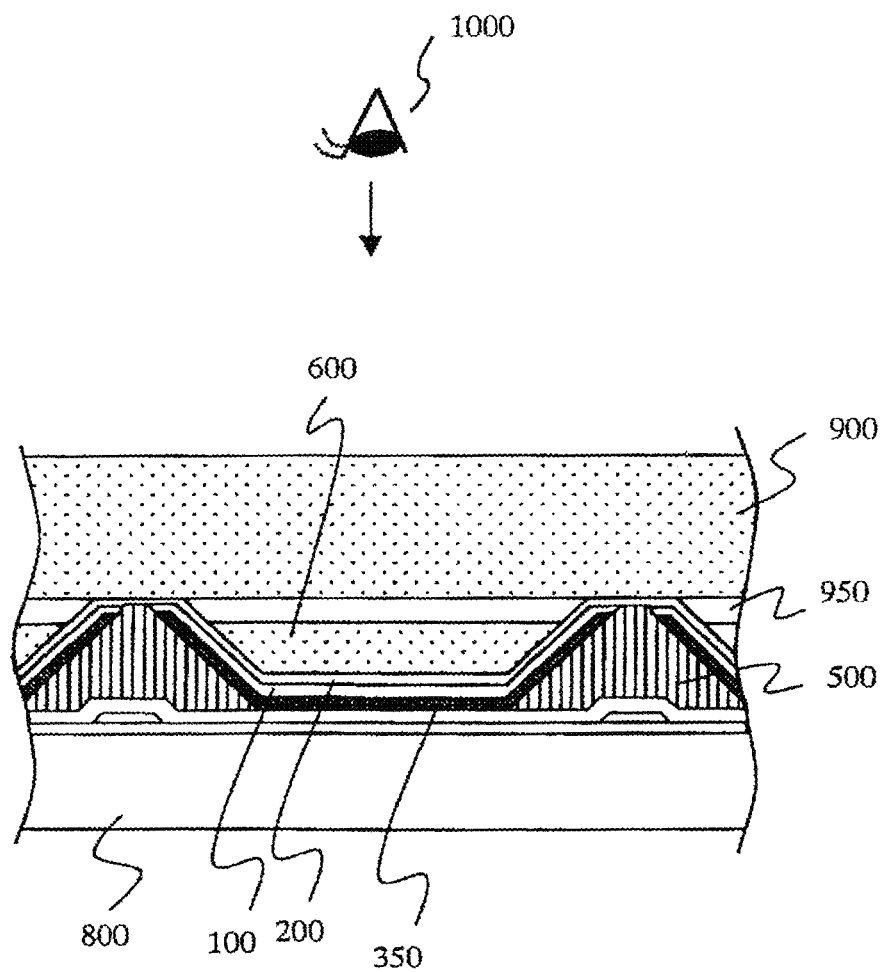
FIG. 30 is a cross sectional view of a picture element explaining the eighth embodiment of the display device according to the present invention.

Next, we will explain another embodiment of this invention. FIG. 30 shows a cross sectional view of a picture element explaining another embodiment of the display device according to the present invention. This embodiment is the display device wherein a modification is applied to the embodiment explained in FIG. 23 such that the reflective electrode is eliminated and the tilted reflective surface 700 shown in FIG. 23 is replaced by the reflective electrode 350 that functions as the tilted reflective surface 700 shown in FIG. 30 as well. Since the other constructions are same as the above embodiment, we use the same signs and notations for the same portions and omit detailed explanations. For this case, a quantity of fabrication process reduces and the productivity is improved by high throughput because the reflective electrode and the tilted reflective surface are formed by a single layer. However, for this construction, there is a possibility of failure as no light emitted from a part of a picture element because the reflective electrode 350 tends to be broken on the ridge of the bank 500 if the picture element is segregated Into a plurality of light emitting areas.

Figure 31:
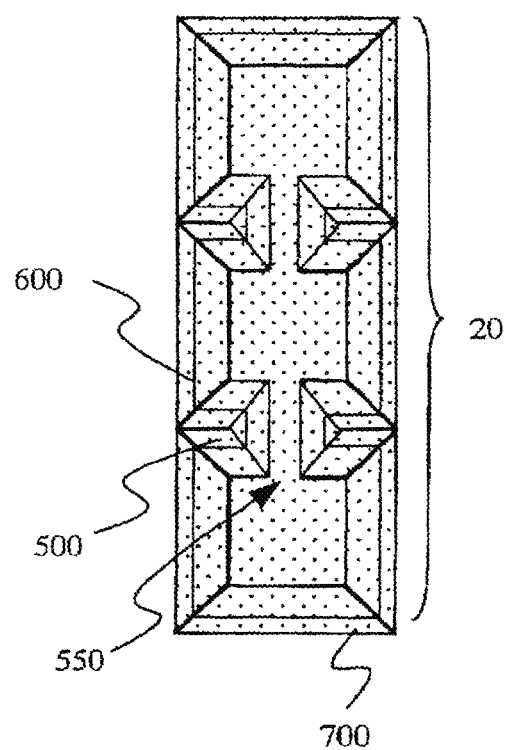
FIG. 31 is a plan view of a picture element explaining the eighth embodiment of the display device according to the present invention.

FIG. 31 shows a planar view showing a part the display device of an embodiment of this invention. It shows a unit picture element composing of one of additive primary colors given by a red-color emission pixel, a green-color emission one and blue-color emission one therein. In this invention, it features that a portion of the bank 500 that segregates the picture element into a plurality of areas as shown in the above embodiments is eliminated so that the areas are combined into a single flat surface. Therefore the picture element is formed into a flat surface of which portions are linked by flat surface 550 which is the surface on which no bank portion exists. In other words, the reflective electrode, the organic layer and the transparent electrode is formed in a single flat plane without riding over the step difference caused by the bank. Therefore, as explained in the above embodiment by using FIG. 30, the connection of the electrode is maintained by the flat plane area even for the construction that the electrode may be cut on the ridgeline of the bank and the failure such that no light emits from a part of area of the picture element does not tend to occur. In other words, the failure of electrode break is prevented by eliminating a portion of the bank to make a single combined flat plan in the picture element.

The Ninth Embodiment

Figure 32:
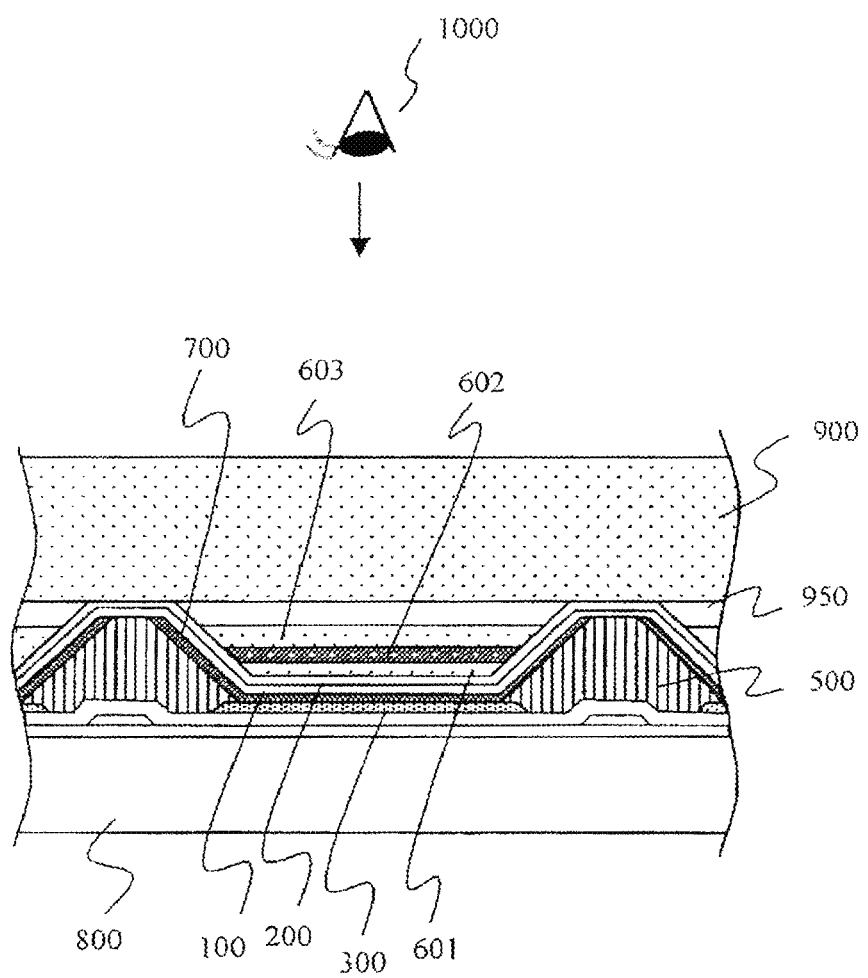
FIG. 32 is across sectional view of a picture element explaining the ninth embodiment of the display device according to the present invention.
Figure 33:
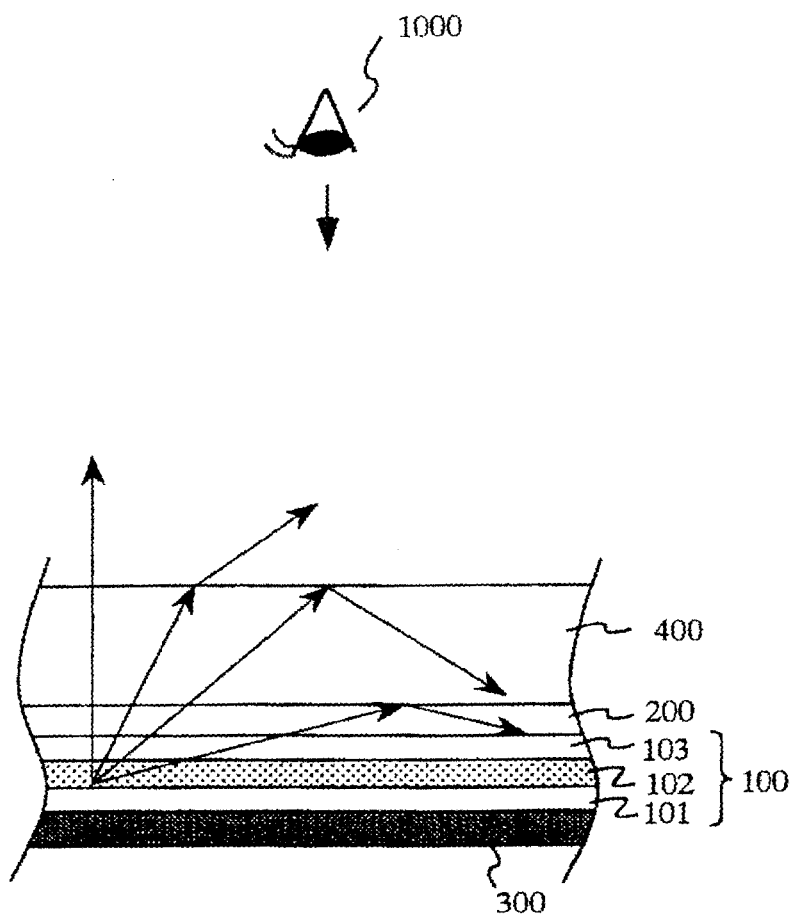
FIG. 33 is a schematic view of an example of the construction and the display operation regarding the conventional OLED.
Figure 34:
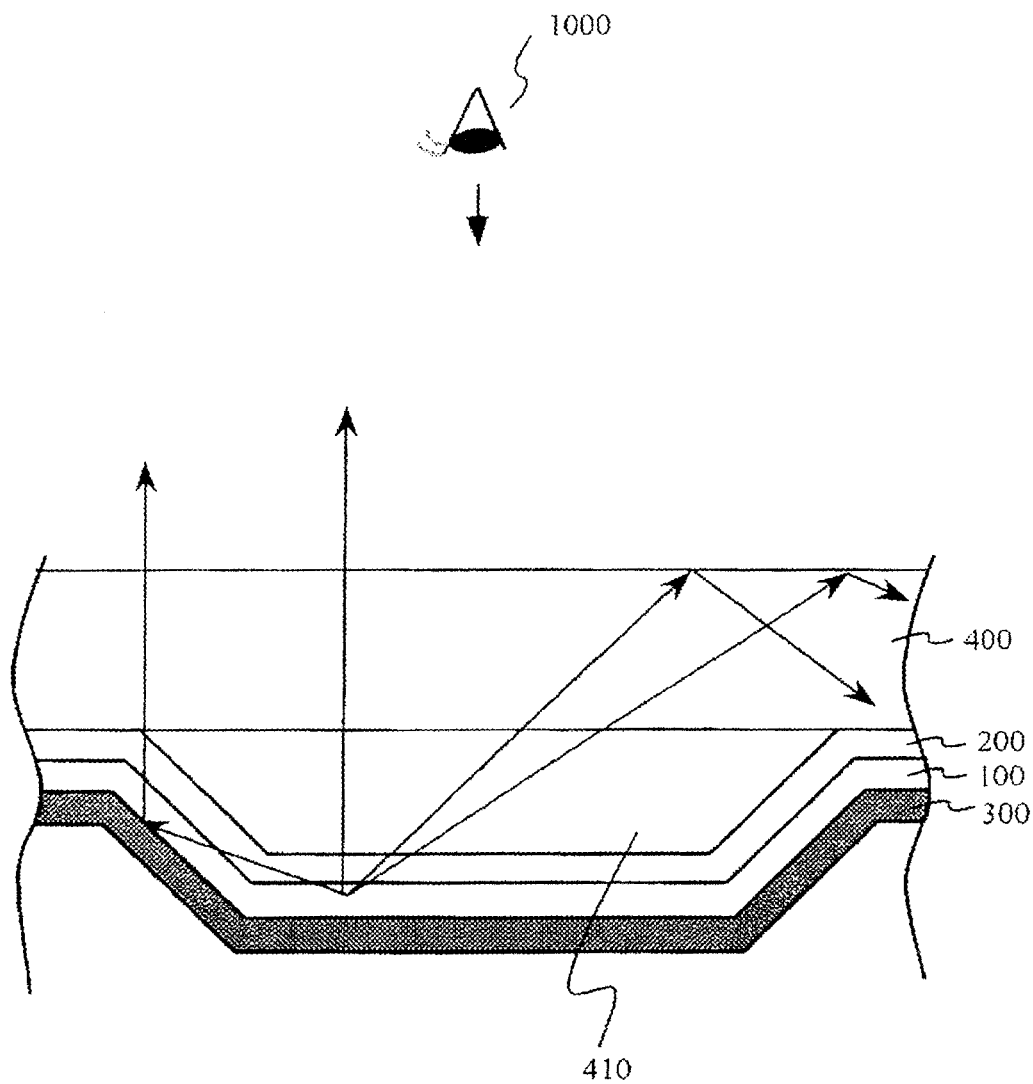
FIG. 34 schematically shows an example of a cross sectional view of the conventional OLED.

Next, we explain another embodiment of this invention. FIG. 32 shows a cross sectional view of a picture element explaining another embodiment of the display device according to the present invention. This embodiment is the display device wherein a modification is applied to the embodiment explained in FIG. 1 such that the organic layer that is divided into a red-color pixel, green-color one and a blue-color one is made a single blue-color organic layer and the optical waveguide layer on the area of the red-color pixel and that of the green-color pixel have color changing medium layers as red-color fluorescence and green-color fluorescence are generated by the illumination of the blue-color light emission from the single blue-color organic layer, respectively. Since the other constructions are same as the above embodiment, we use the same signs and notations for the same portions and omit detailed explanations. Several methods for full color OLED display has already been proposed and proven several methods for full color OLED display, among which there is a technical method combining blue light-emitting element and fluorescent color changing media (called CCM method, hereinafter). The CCM method is to excite the fluorescent dye layer by blue light emitting from blue light emitting layer and obtain the green light and the red light converted thereby, resulting to make three primary color lights. (see The journal of the institute of image information and television engineers, Vol. 54, No. 8, pp. 1115-1120).

Next, we explain another embodiment of this invention by applying the CCM method. The picture element that emits blue light is formed, as same as the above embodiment, with a single optical waveguide layer, however the picture elements which emit red and green lights are formed with the first optical waveguide layer 601, the color changing medium layer 602 and the second optical waveguide layer 603 stacked in this order in the basin area surrounded by the bank 500.

The first and the second optical waveguide layers can consist of transparent resin or transparent inorganic material such as silicon nitride, silicon oxide, titanium oxide, etc. It is desired that the refractive index of the first optical waveguide layer 601 is larger than that of the transparent electrode 200. Because the light emitting from the organic layer 100 and penetrating the transparent electrode 200 does not totally reflect at the boundary surface between the first optical waveguide layer 601 and the transparent electrode 200 and is led into the color changing medium layer 602 with high efficiency, so that we can obtain a large external coupling efficiency by the large amount of the desired light converted in the color changing medium layer. We can use titanium oxide as the higher refractive optical waveguide layer material than ITO or IZO.

It is important that the heights of the color changing medium layer and the second optical waveguide layer are lower than that of the tilted reflective surface. In this case, the light of the light emitting from the color changing medium layer propagates in the optical waveguide layer when it is emitted in almost parallel to the surface of the optical waveguide layer, and then some portion of the light is reflected on the tilted reflective surface and goes towards the viewer 1000 as an image picture light. This reflection raises the external coupling efficiency. We can prevent the optical cross-talk and blur since the light emitting from the color changing medium 602 does not travel into other picture elements and no light travels through the other picture elements and reaches to the viewer 1000 after the reflection at the tilted reflective surface surrounding the other picture elements. Therefore we can obtain clear images and pictures and high quality picture is realized. Though we can obtain an improvement of the external coupling efficiency without the second optical waveguide layer 603, it is important to have a gap 950 which has the similar refractive index to the air between the color changing medium layer and seal-off material. Because in case of no gap, the light of the light emitted from the color changing medium layer partly travels into the seal-off material and is lost therein, or partly propagates into other picture element and comes to the viewer 1000 which results in the optical cross-talk and blur.

Next, we explain another embodiment of this invention. The embodiment is the one wherein a modification is applied to the above embodiments explained by referring to FIG. 1 and FIG. 2 such that the organic layer that is separately designed for a red-color light emitting picture element, green-color light emitting one and blue-color light emitting one is all used for a white-color light emitting form the organic layer, the red-pigment, green-one and blue-one are mixed and dispersed in the optical waveguide layers corresponding to the red-color, the green-color and the blue-color lights emitting picture elements, respectively. Since the other constructions are same as the above embodiment, we omit detailed explanations for the portion that has the same function.

There are two kinds of the constructions; the organic layer that emits white-color light as stacked layers of which each layer has different light emission for each other and a single layer that includes different doped dies that emit different color lights. An example for the former is a combination of TPD and partly doped Alq3 with Nail red and 1,2,4-triazole derivative (TAZ). An example for the latter is doped PVK with three kinds of dopants, for example 1,1,4,4-tetraphenyl-1,3 butadiene, coumarin 6, DCM1. For either material, the white-color light emitting organic layer which has high emission efficiency and long life is desirable.

The optical waveguide layer is, as same as the embodiment explained by referring to the FIG. 16B, formed by blowing the optical waveguide layer compound material from the ink-jet head 850 to the basin area surrounded by the bank 500. In this embodiment, the optical, waveguide layer compound includes pigment other than solvent and transparent binder resin. As for the pigments included in the optical waveguide layer which is formed with the optical waveguide layer compound blown are mixed and dispersed for each picture elements as red, green and blue pigments for the picture elements for red-, green- and blue-colors, respectively. We can exploit those pigments used for the color filters applied to liquid crystal display devices.

In this embodiment, the white-color light emitted from the organic layer, directly or after reflecting on the reflective electrode, travels into the optical waveguide layer and the light of which wave-length is different from the spectrum of the color of the included pigment filters is mostly absorbed, though, for example, the light which has the wavelength corresponding to the red-color light can penetrate the optical waveguide layer which corresponds to the red-color picture element due to inclusion of such pigment. Therefore, the light that travels to the viewer after penetrating the optical waveguide layer or traveling in the optical waveguide layer and then reflecting on the tilted reflective surface is the red light provided it emits from the picture element designed for the red-color light emission. Similar to the red color picture element for the picture element designed for green-color or blue-color light emission, we can obtain the lights of these colors. For this embodiment, we need simply one organic layer, the process features to be easy fabrication since no coloring from such three primary colors for each picture element. In addition, as same as the above embodiments, we can improve the external coupling efficiency by the effects of the optical waveguide layers and the tilted reflective surface and obtain high quality image which has no optical cross talk and does the clear image.

In the embodiments we have discussed, we have shown so-called active matrix type display devices such as the presentation of the image is done by controlling the operation of a plurality of light-emitting diodes that compose a plurality of picture elements aligned in a formation of matrix with use of driver elements, however this invention is not confined in such embodiments. In other words, the construction that has improved the external coupling efficiency shown in the above embodiment can be applied to those display devices so-called passive matrix type and to merely illuminating devices. As for the light emitting elements, it is obvious that the device that light-emits in the medium which has larger refractive index than the air and that has a flat plan in at least a part of the light emitting layer, such as inorganic electro-luminescent devices or inorganic light emitting diodes, can be applied to this invention.

The invention claimed is:

1. A display device comprising:
    a plurality of light-emitting elements aligned on a TFT substrate in a formation of a matrix, the plurality of light-emitting elements each having a flat surface portion and including an anode, a light-emitting layer arranged on the anode, and a cathode arranged on the light-emitting layer;
    an insulation layer formed on the TFT substrate and under the light emitting element;
    a tilted metal which is provided on a peripheral area surrounding the flat surface portion of each of the plurality of light-emitting elements and has a tilt angle against the flat surface portion of each of the plurality of light-emitting elements; and
    an optical waveguide layer which is arranged on the cathode and includes a first layer and a second layer on the first layer, a first refraction index of the first layer being larger than a second refraction index of the second layer,
    wherein the tilted metal is provided on a surface of a slope of a bank that is provided on the insulation layer,
    wherein the bank covers an edge of the anode and has an opening exposing a part of a surface of the anode, wherein the optical waveguide layer is arranged directly above the part of the surface of the anode, wherein a width of a cross section of the bank becomes smaller as the cross section comes farther away from a surface of the TFT substrate, wherein a sealing film is placed on the plurality of light-emitting elements, the optical waveguide layer, the tilted metal, and the TFT substrate, wherein the light emitting element emits light in a direction from the TFT substrate to the sealing film, and wherein a first distance between the TFT substrate and a first top surface of the optical waveguide layer is smaller than a second distance between a second top surface of the bank and the TFT substrate.

2. The display device according to claim 1, further including:

a predetermined metal between the TFT substrate and the insulation layer; and an extended metal which is connected to the anode, wherein a gap exists between the optical waveguide layer and the sealing film, wherein the display device comprises a plurality of pixels aligned on the TFT substrate in a formation of a matrix, wherein the tilted metal is connected to the cathode, wherein the predetermined metal is connected to the extended metal via a contact hole in the insulation layer, wherein each of the bank and the tilted metal overlaps the extended metal and the contact hole in plan view, and wherein each of the plurality of pixels includes each of the plurality of light-emitting elements.

3. The display device according to claim 2, wherein the bank is sandwiched between the tilted metal and the anode in the peripheral area surrounding the flat surface portion of each of the plurality of light-emitting elements, and wherein the bank is not arranged on the flat surface portion of each of the plurality of light-emitting elements in plan view.

4. The display device according to claim 3, further comprising:

a plurality of driver elements each connected to each of the plurality of light-emitting elements;

a plurality of capacitor elements each of which is connected to each of the light emitting elements and receives each of a plurality of image signals; and a plurality of switching elements each of which is connected to each of the capacitor elements and each of the light emitting elements and controls input of each of the plurality of image signals to each of the capacitor elements, wherein the predetermined metal is connected to the driver element.

5. The display device according to claim 1, wherein a third refraction index of the cathode is smaller than a first refraction index.

6. The display device according to claim 5, wherein the optical waveguide layer has a cross sectional formation so that a cross sectional width of the optical waveguide layer becomes wider as a distance from the surface of the TFT substrate increases, and wherein a height of the tilted metal from the flat surface of the light-emitting layer is larger than a maximum height of the optical waveguide layer.

7. The display device according to claim 1, wherein the sealing film includes a plurality of inorganic layers and a resin layer.

8. A display device including:

a plurality of light-emitting elements aligned on a TFT substrate in a formation of a matrix, at least one of the plurality of light-emitting elements having a flat surface portion and including an anode, a light-emitting layer arranged on the anode, and a cathode arranged on the light-emitting layer;

an insulation layer formed on the TFT substrate and under the light emitting element;

a first metal which is provided on a surface of a slope of a first bank that is provided on the insulation layer;

a second metal which is provided on a surface of a slope of a second bank that is provided on the insulation layer;

a predetermined layer which is arranged on the cathode and includes a first layer made of an organic material and a second layer made of an inorganic material on the first layer, wherein the flat surface portion of the at least one of the plurality of light-emitting elements is arranged between the first metal and the second metal, wherein the first and second banks cover an edge of the anode and have an opening exposing a part of a surface of the anode, wherein the predetermined layer is arranged directly above the part of the surface of the anode, wherein a width of a cross section of each of the first and the second banks becomes smaller as the cross section comes farther away from a surface of the TFT substrate, wherein a sealing film is placed on the plurality of light-emitting elements, the predetermined layer, the first metal, the second metal, and the TFT substrate, wherein the light emitting element emits light in a direction from the TFT substrate to the sealing film, wherein a first distance between the TFT substrate and a first top surface of the predetermined layer being smaller than a second distance between a second top surface of the first bank and the TFT substrate.

9. The display device according to claim 8, further including:

a predetermined metal between the TFT substrate and the insulation layer, and an extended metal is connected to the anode, wherein a gap exists between the predetermined layer and the counter substrate, wherein at the flat surface portion of the at least one of the plurality of light-emitting elements, the anode is connected to the organic layer, and the organic layer is connected to the cathode, wherein the first metal and the second metal are connected to the cathode, wherein the predetermined metal is connected to the extended metal via a contact hole in the insulation layer, and wherein each of the first bank and the first metal overlaps the extended metal and the contact hole in plan view.

10. The display device according to claim 9, wherein inactive gas is arranged in the gap.

11. The display device according to claim 9, wherein the first and the second banks are formed in an integrated manner, wherein a peripheral metal of the anode as the predetermined metal surrounds the flat surface portion of the at least one of the plurality of light-emitting elements in plan view, and wherein the first bank is arranged between the first metal and the peripheral metal of the anode, and the second bank is arranged between the second metal and the peripheral metal of the anode.

12. The display device according to claim 11, further comprising:
a plurality of driver elements each connected to each of the plurality of light-emitting elements;
a plurality of capacitor elements each of which is connected to each of the light emitting elements and receives each of a plurality of image signals; and
a plurality of switching elements each of which is connected to each of the capacitor elements and each of the light emitting elements and controls input of each of the plurality of image signals to each of the capacitor elements, and
wherein the peripheral metal is connected to the driver element.

13. The display device according to claim 11, wherein the first metal is provided on a peripheral area surrounding the flat surface portion of the at least one of the plurality of light-emitting elements and has a first tilt angle against the flat surface portion of the at least one of the plurality of light-emitting elements,
wherein the second metal is provided in the peripheral area surrounding the flat surface portion of the at least one of the plurality of light-emitting elements and has a second tilt angle against the flat surface portion of the at least one of the plurality of light-emitting elements, and
wherein the first and the second banks includes the peripheral area formed on the peripheral metal of the anode.

14. The display device according to claim 8, wherein the sealing film includes a plurality of inorganic layers and a resin layer.

15. The display device according to claim 14, wherein the predetermined layer has a cross sectional formation so that a cross sectional width of the predetermined layer becomes wider as distance from the surface of the TFT substrate increases, and
wherein a height of the first metal from the flat surface portion of the at least one of the plurality of light-emitting elements is larger than a maximum height of the predetermined layer.

16. A display device comprising:
a plurality of light-emitting elements aligned on a TFT substrate in a formation of a matrix, at least one of the plurality of light-emitting elements having a flat surface portion and including an anode, a light-emitting layer arranged on the anode, and a cathode arranged on the light-emitting layer;
an insulation layer formed on the TFT substrate and under the light emitting element;
a metal is provided on a surface of an insulation bank that is provided on the insulation layer;
a predetermined electrode is provided directly above the metal;
a predetermined layer arranged on the cathode, a first distance between the TFT substrate and a first top surface of the predetermined layer being smaller than a second distance between a second top surface of the insulation bank and the TFT substrate,
wherein the insulation bank covers an edge of the anode and has an opening exposing a part of a surface of the anode,
wherein the predetermined layer arranged directly above the part of the surface of the anode,
wherein each of the insulation bank and the first metal surrounds the flat surface portion of the at least one of the plurality of light-emitting elements in plan view,
wherein a width of a cross section of the insulation bank becomes smaller as the cross section comes farther away from a surface of the TFT substrate,
wherein a sealing film is placed on the plurality of light-emitting elements, the predetermined layer, the metal, and the TFT substrate, and
wherein the light emitting element emits light in a direction from the TFT substrate to the sealing film.

17. The display device according to claim 16, further including:
a predetermined metal between the TFT substrate and the insulation layer, and
an extended metal is connected to the anode,
wherein a gap exists between the predetermined layer and the counter substrate,
wherein at the flat surface portion of the at least one of the plurality of light-emitting elements, the anode is connected to the organic layer, and the organic layer is connected to the cathode,
wherein the metal is connected to the cathode,
wherein the predetermined metal is connected to the extended metal via a contact hole in the insulation layer, and
wherein each of the insulation bank and the metal overlaps the extended metal and the contact hole in plan view.

18. The display device according to claim 16, wherein a peripheral metal of the anode surrounds the flat surface portion of the at least one of the plurality of light-emitting elements in plan view,
wherein the insulation bank is arranged between the metal and the peripheral metal of the anode and
wherein the sealing film includes a plurality of inorganic layers and a resin layer.

19. The display device according to claim 17, further comprising:
a plurality of driver elements each connected to each of the plurality of light-emitting elements;
a plurality of capacitor elements each of which is connected to each of the light emitting elements and receives each of a plurality of image signals; and
a plurality of switching elements each of which is connected to each of the capacitor elements and each of the light emitting elements and controls input of each of the plurality of image signals to each of the capacitor elements,
wherein the predetermined metal is connected to the driver element.

20. The display device according to claim 18, wherein the metal is provided on a peripheral area surrounding the flat surface portion of the at least one of the plurality of light-emitting elements and has a tilt angle against the flat surface portion of the at least one of the plurality of light-emitting elements, and
wherein the insulation bank includes the peripheral area formed on the peripheral metal of the anode.

* * * * *